(12) United States Patent
Hitchman

(10) Patent No.: US 10,193,318 B1
(45) Date of Patent: Jan. 29, 2019

(54) EFFICIENT INSTALLATION ELECTRICAL HARDWARE SYSTEM AND METHOD OF USE

(71) Applicant: Stephen A. Hitchman, Cherry Hill, NJ (US)

(72) Inventor: Stephen A. Hitchman, Cherry Hill, NJ (US)

(*) Notice: Subject to any disclaimer, the term of this patent is extended or adjusted under 35 U.S.C. 154(b) by 0 days.

(21) Appl. No.: 15/731,668

(22) Filed: Jul. 14, 2017

(51) Int. Cl.
| | |
|---|---|
| *H02G 3/12* | (2006.01) |
| *H02G 3/08* | (2006.01) |
| *H02G 3/18* | (2006.01) |
| *H02G 3/10* | (2006.01) |
| *E04F 21/00* | (2006.01) |
| *H05K 5/02* | (2006.01) |
| *H02G 1/00* | (2006.01) |

(52) U.S. Cl.
CPC ......... *H02G 3/085* (2013.01); *E04F 21/0076* (2013.01); *H02G 3/10* (2013.01); *H02G 3/121* (2013.01); *H02G 3/18* (2013.01); *H05K 5/0247* (2013.01); *H02G 1/00* (2013.01)

(58) Field of Classification Search
CPC .......... H02G 3/08; H02G 3/0814; H02G 3/10; H02G 3/12; H02G 3/121; H02G 1/00; H02G 3/20; H02G 3/14; H01R 13/46; H05K 5/00; E04F 21/00; E04F 21/0076; B25H 7/04
USPC ....................... 174/50, 53, 57, 58, 480, 481; 220/3.2–3.9, 4.02; 248/948, 343; 33/528, DIG. 10
See application file for complete search history.

(56) References Cited

U.S. PATENT DOCUMENTS

| | | | | |
|---|---|---|---|---|
| 4,335,511 A * | 6/1982 | Bowling | ................. | E04F 21/00 220/3.4 |
| 4,384,396 A * | 5/1983 | Smolik | ................ | B23Q 35/102 33/DIG. 10 |
| 4,388,890 A * | 6/1983 | Wester | ..................... | H02G 1/00 116/204 |
| 5,297,690 A * | 3/1994 | Bardaville | ............. | H02G 3/123 220/3.2 |
| 6,452,097 B1 * | 9/2002 | DeWall | .................... | H02G 1/00 174/58 |

(Continued)

*Primary Examiner* — Angel R Estrada
(74) *Attorney, Agent, or Firm* — Brian K. Dinicola

(57) ABSTRACT

An improved installation system for electrical hardware, such as power outlets, electrical switches, light fittings, ceiling fans and the like, whereby the cutting of their installation access holes in drywall panels is accomplished much faster than prior art methods and with a high degree of accuracy by the use of the hole cutting system, comprising the magnetic block assembly, corresponding magnetic template assembly and the hole cutter. In conjunction with the aforementioned; the electrical hardware's associated electrical boxes are wired directly to their electrical supply and the hardware is in turn, electrically connected to them by their respective sets of electrical terminals which make simultaneous contact with each other upon their installation. Additionally, the latching pawl mechanism and alignment device supports the weight of heavy light fittings and ceiling fans and aligns their electrical connections while they're being fixed into their installed position. These features taken together make this improved installation system substantially superior to all prior art.

18 Claims, 16 Drawing Sheets

(56) References Cited

U.S. PATENT DOCUMENTS

| | | | | |
|---|---|---|---|---|
| 7,367,131 B1* | 5/2008 | Hordis | ................... | H02G 3/12 |
| | | | | 174/58 |
| 7,572,978 B1* | 8/2009 | Keith, Jr. | ................. | H02G 3/00 |
| | | | | 174/58 |
| 7,926,195 B2* | 4/2011 | Crorey | .................. | G01V 3/081 |
| | | | | 33/528 |
| 9,711,955 B2* | 7/2017 | Hitchman | ................ | H02G 1/00 |

* cited by examiner

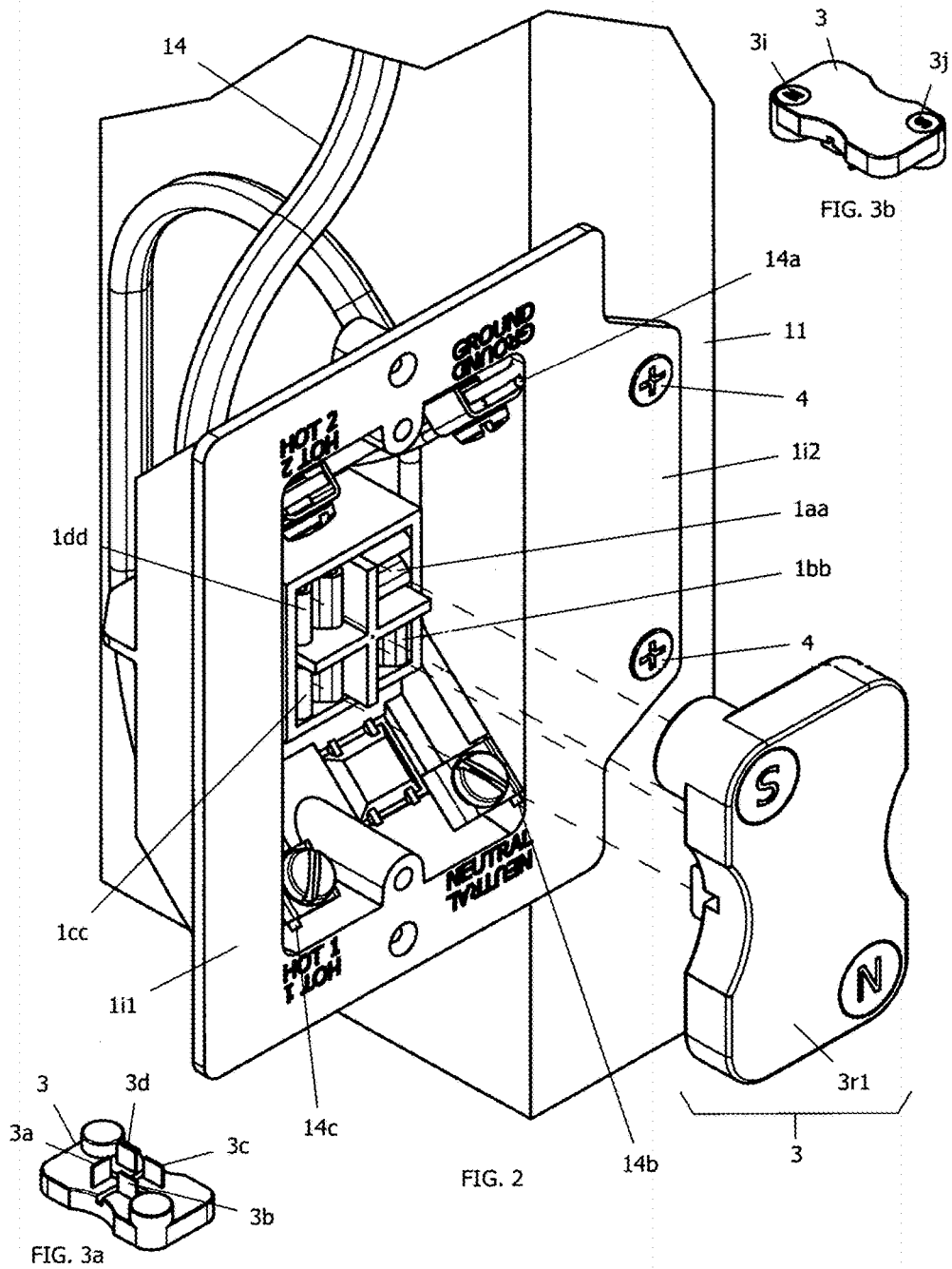

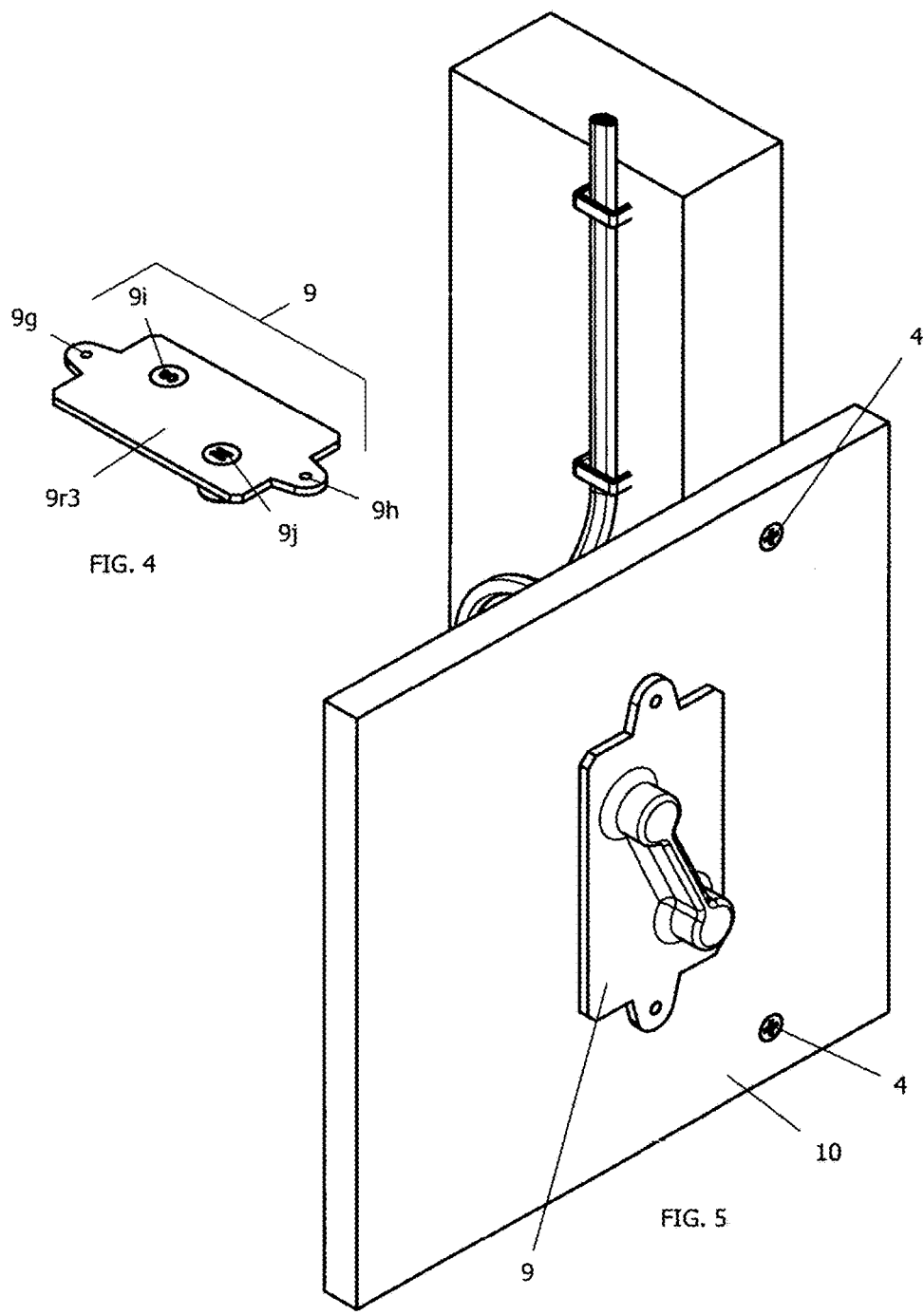

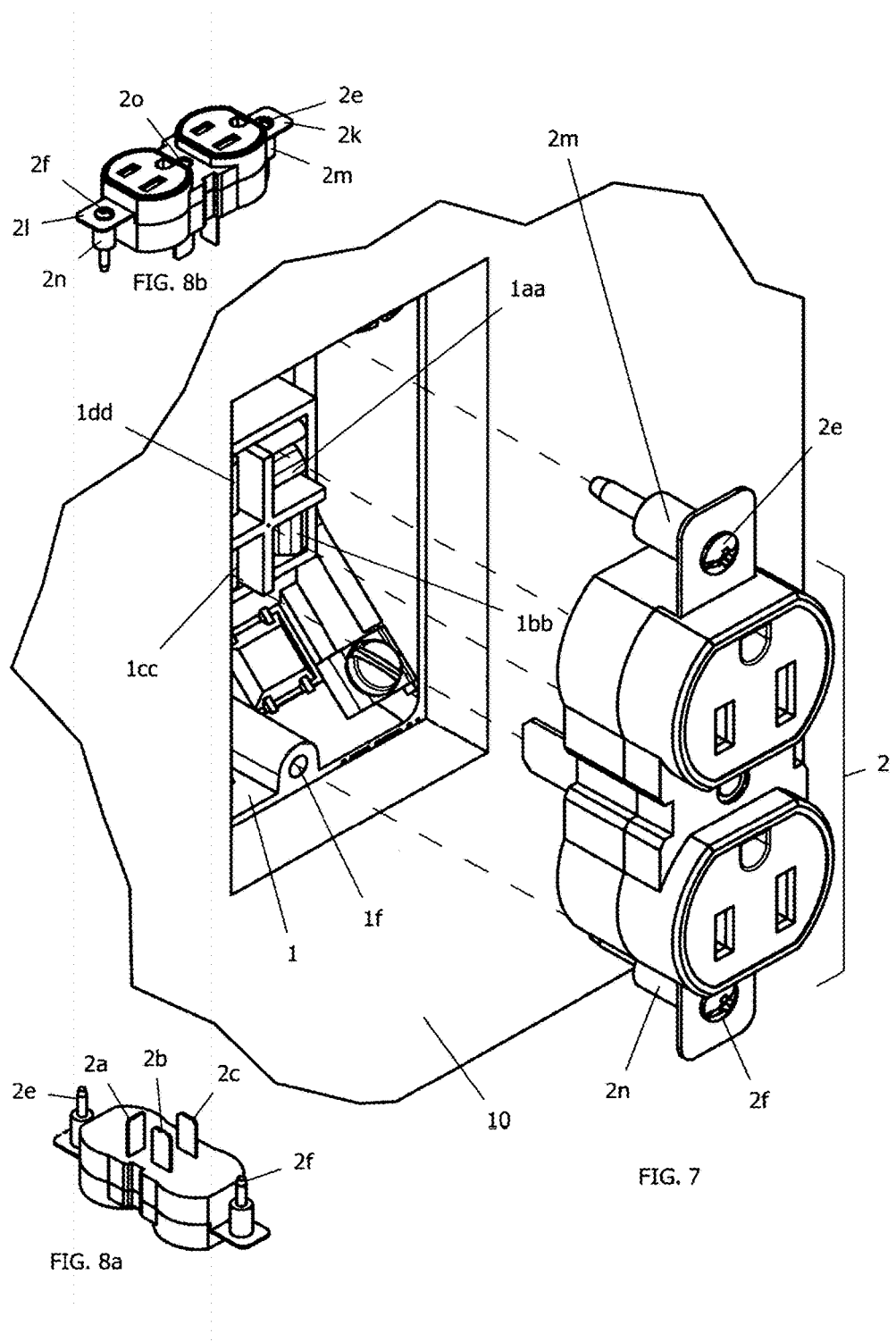

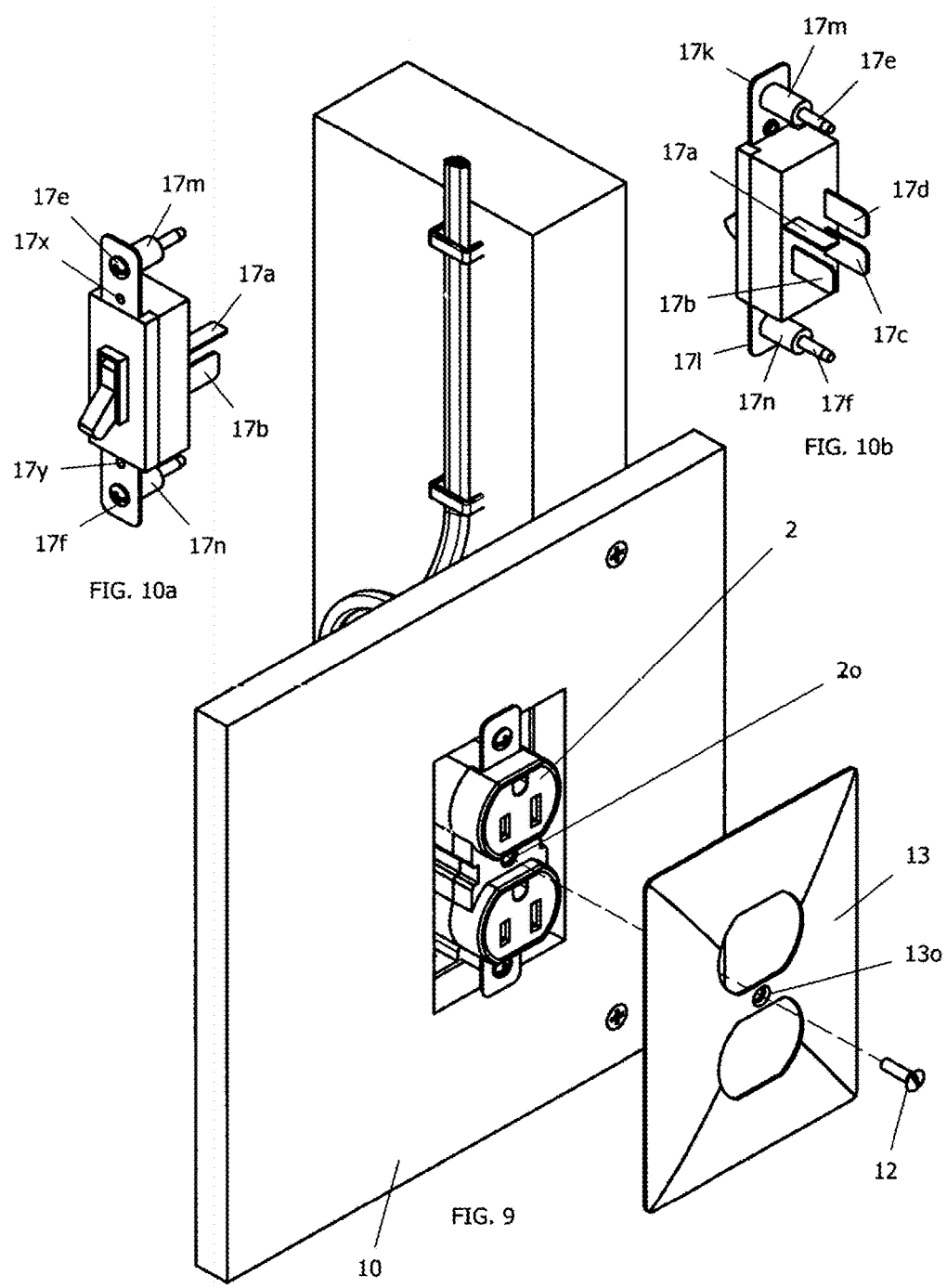

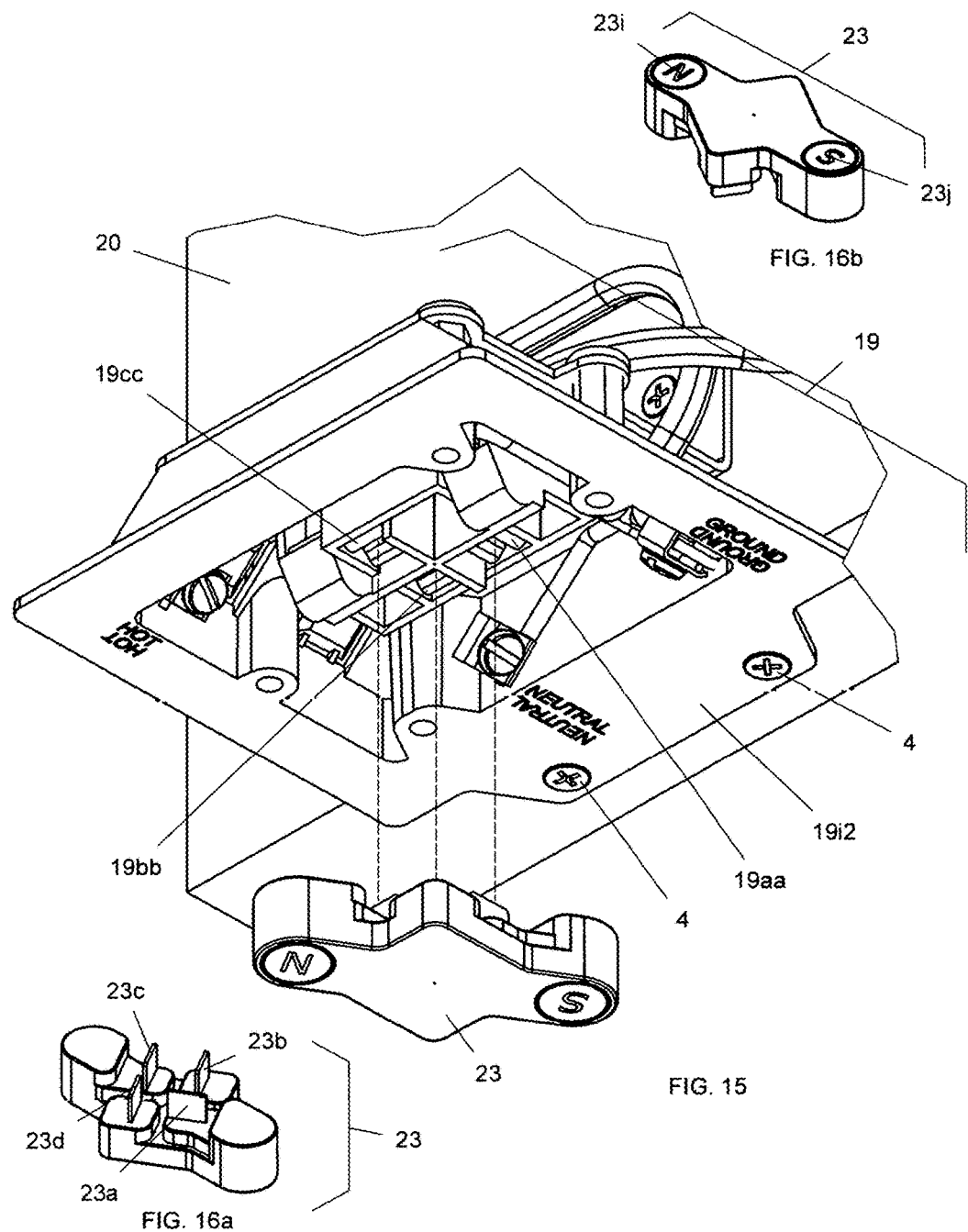

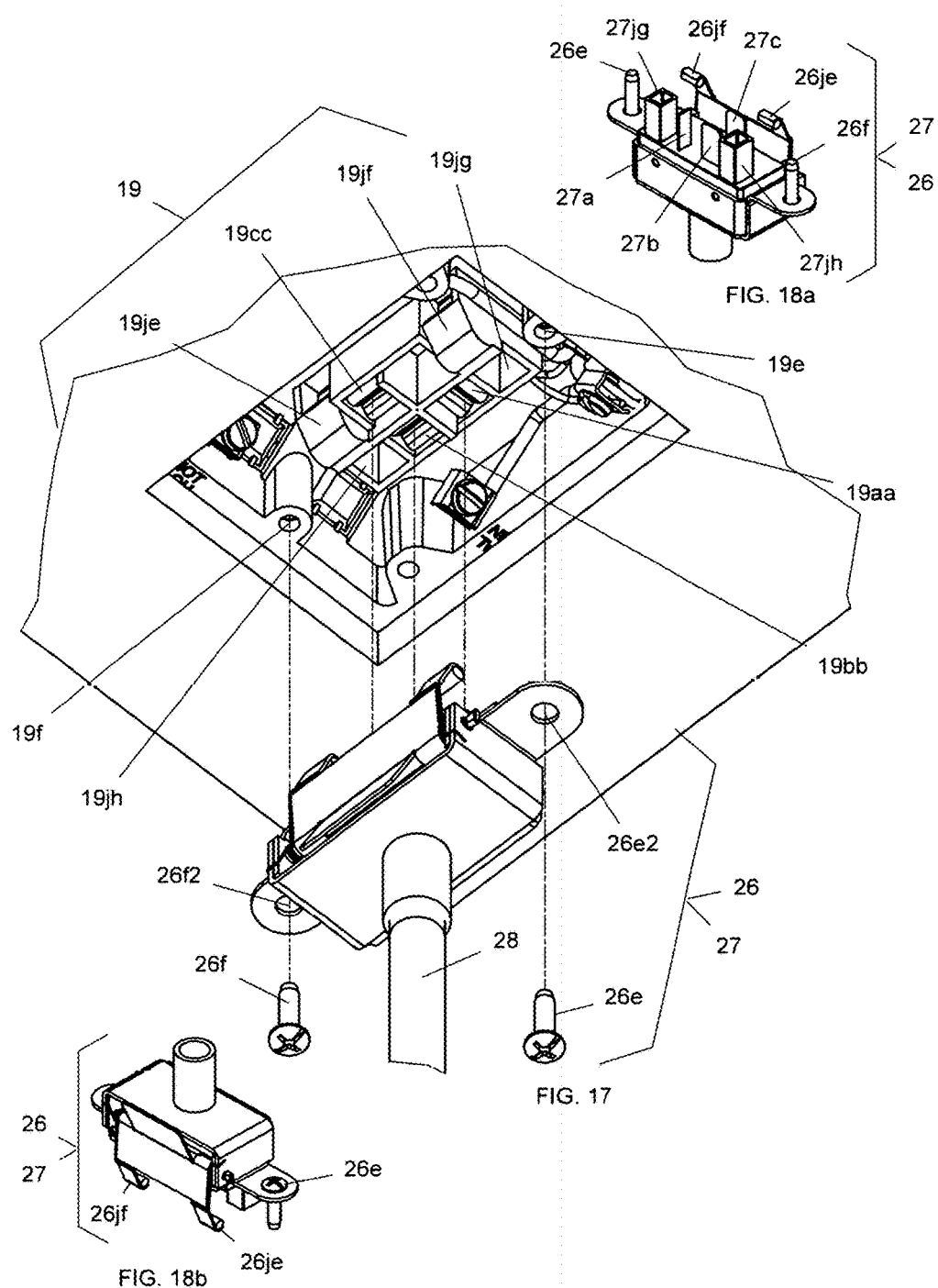

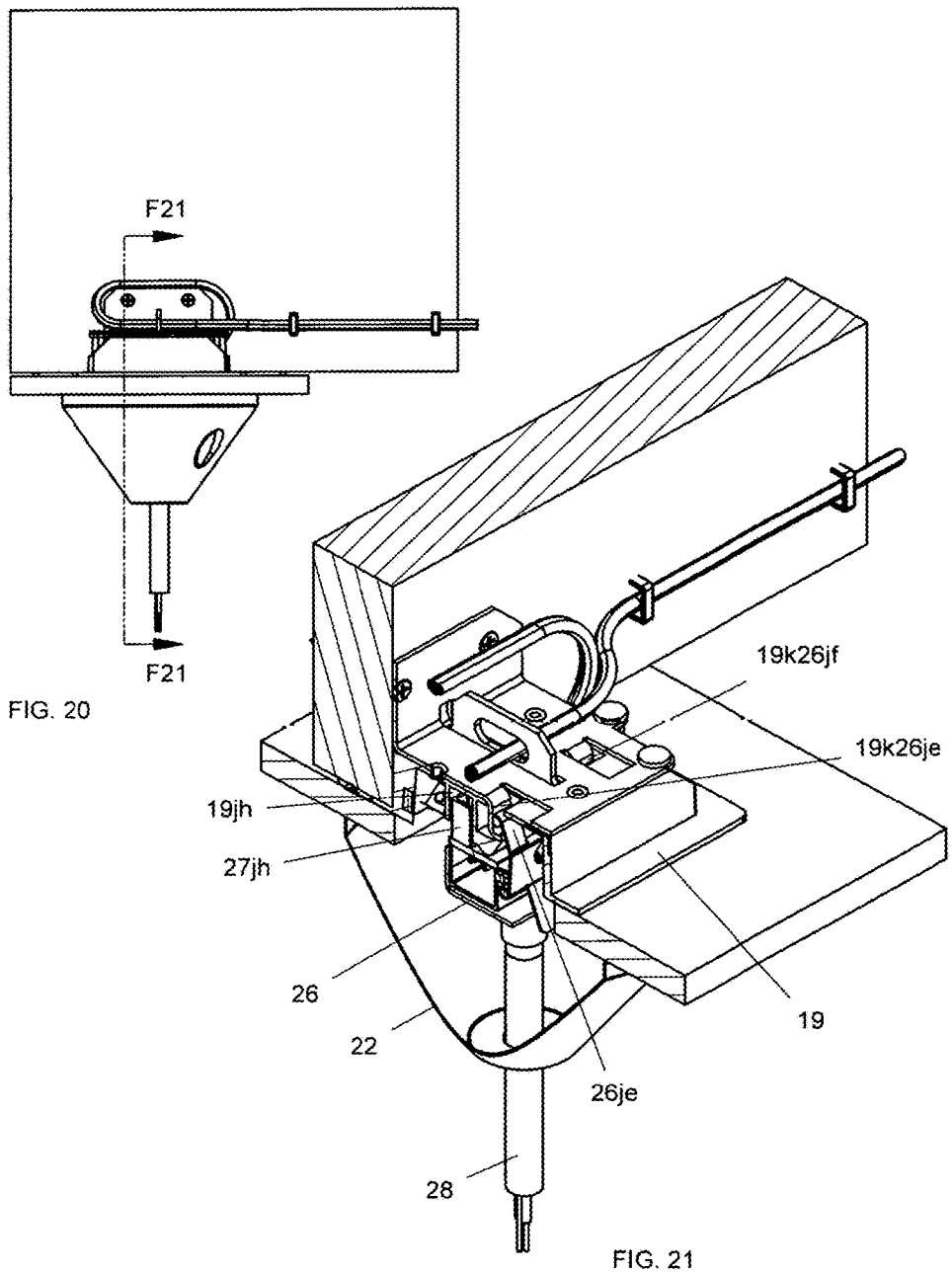

EFFICIENT INSTALLATION ELECTRICAL HARDWARE SYSTEM AND METHOD OF USE

CROSS REFERENCE TO OTHER APPLICATIONS

This Application is a CIP of Ser. No. 14/086,665.

BACKGROUND OF THE INVENTION

1. Field of the Invention

The present invention relates generally to the field of installation of power outlets, electric switches and lighting fixtures. During a recent home renovation, the installation of domestic power outlets, electric switches, light fittings and their associated electrical boxes was found to be time consuming and installer unfriendly, particularly for a do-it-yourself installer. It was determined that these issues presented an opportunity for improvements to the method of installation of standard United States power outlet, electric switches, light fittings, their corresponding electrical boxes ("electrical hardware"). Moreover it was realized that as a result of such improvements, considerable time and money can be saved during home construction if the electrical component installation process is made simpler, faster and more user friendly.

The improvements are achieved using a cartridge style installation system with a magnetic block, its matching magnetic template and innovative hole cutter. These devices speed up and simplify the installation process considerably, as well as making the location and cutting of installation holes completely accurate, every single time. The magnetic block is removably installed within the electrical box prior to installation of a drywall panel over them both. Subsequently, the matching magnetic template is attached to the outer surface of the drywall panel, it being held in place by the mutual magnetic attraction between its magnets and those of the magnetic block through the intervening drywall panel. Thus the template is accurately located for marking the hole location. The hole cutter is then be used to accurately and quickly cut the installation hole for a power outlet, electric switch, light fitting, or ceiling fan as appropriate. The drywall panel is put up only once.

2. Description of the Prior Art

Previously, in order to accurately cut wall and ceiling power outlets and electric switch holes in drywall panels, also known as sheetrock and plasterboard, it needed to be offered up to its installed position over the electrical boxes, also known as wall boxes. Then the location of each electrical box had to be determined relative to the drywall panel's front face and the drywall marked with the outline of the desired holes. Conventionally, in order to do this, one or more people needed to hold the drywall panel steadily in its correct position while another person attempted to mark the outline of the desired hole(s) a prior art hole template might also have been used. Alternatively, the drywall needed to be temporarily tacked into position with drywall screws during this process. Either way, this was significantly more difficult for ceiling installations because of the weight of the drywall panels and the much more awkward overhead working position. Once the drywall was temporarily in place, however held, accurately determining the correct locations for the electrical box holes was difficult. This is because the electrical boxes are behind the wide panel of drywall and cannot readily be located from the front. Moreover they are often some distance from the edge of the drywall, making accurate hole location even more difficult.

A number of prior art attempts at overcoming these challenges have been made. However, to a greater or lesser degree, they are all rather unwieldy and without real commercial viability. For specific examples, see subsequent references to U.S. Pat. Nos. 3,745,664, 3,913,235 and 8,099,878.

For purposes of this application, it is necessary to distinguish between "new work" and "old work." New work refers to installation of electrical hardware and wiring in original construction. Old work means installation of electrical hardware and wiring in pre-existing buildings and residences.

Because new work prior art electrical boxes were often designed to have their outer edges more or less flush with the front face of the drywall panel through the cut-out holes, the temporarily positioned drywall panel was often bowed over those boxes during mark out and consequently its edges were distorted from their final installed positions. Prior art electrical boxes that had a depth adjustment feature which allowed them to be initially flush with the rear face of the drywall (avoiding bowing) were still almost as difficult to accurately locate for hole mark out as other prior art alternatives. It follows that power outlet holes in drywall were prone to be mispositioned, sometimes necessitating unsightly repairs or the scrapping of material.

Prior art installation of drywall has been labor intensive and time consuming because it was often first put up into place for the marking out of power outlet and electric switch holes, taken down in order to cut the holes and then finally repositioned for permanent installation. Another problem with the prior art has been its awkward nature and the time it took to wire wall and ceiling power outlets, or light fittings and electric switches. In order to meet building codes, a minimum of 12 inches of power cable wires are often required inside each electrical box. This makes it cumbersome to install the power outlet, electric switch, or light fitting, particularly if more than one power cable needs to be used. This is because all the power cable wires had to be forced back into the electrical box behind the power outlet, electric switch, or light fitting before it was fastened into place. Moreover, wiring the power Outlet, electric switch, or light fitting was often cumbersome and time consuming because the wires had to be held in the right place, wrapped around the electrical terminals, then held steady while the terminal screws were tightened. Therefore it was an operation more easily managed with an assistant.

In the case of prior art ceiling outlets for light fittings, the wiring of light fittings has been even more cumbersome because of having to work overhead and at the same time bear the weight of the light fitting. Ceiling fans and other large light fittings often had a temporary method of suspending their weight while wiring was completed. Even then, their size and bulky shape usually obstructed the electrical box, making wiring more difficult.

There have been several prior art attempts to overcome some of these concerns. However, to a greater or lesser degree, they have all fallen short of a complete solution for a number of reasons, which will now be explained. For example, U.S. Pat. No. 6,884,111 ("the '111 reference"), also published as U.S. Pat. No. 7,081,010, U.S. Pat. No. 7,762,838, U.S. Pat. No. 8,028,408, US20030236010, US20050250378, US20080190640, US20100218374 and US20120021623 discloses a safety module electrical distribution system, which as far as is known, is the only commercially available product addressing any of these concerns. While this patent includes some novel safety features (column 2, lines 20-24), it is questionable whether the North American construction industry found these features of sufficient compelling value for the product to remain commercially viable for long. Moreover, this safety module electrical distribution system fails to address the issues of speeding up or simplifying the wiring of its associated electrical box. See FIGS. 16C and 16D of the '111 reference and the associated write up at column 12, lines 24-41. Also see the electrical box for product #2 at website http://protectconnect.com/spinningProducts.html.

This safety module electrical distribution system also completely fails to teach any improvement to the drywall installation process.

Next, U.S. Pat. No. 7,744,407 ("the '407 reference") provides for a modular circuit system for use in an electrical wiring system with a circuit box and various modular inserts: power outlets, electric switches and the like. See column 1, lines 50 and 51. The circuit box has multiple sub-components arranged in a less than robust configuration and not conducive to commercial production (FIGS. 1 thru 27). The connections between the circuit box and the various modular inserts are flimsy and prone to misalignment and breakage. Like the previous reference, this reference fails to address the issues of speeding up or simplifying the wiring of its circuit box or installation of the drywall.

Also, U.S. Pat. No. 7,034,222 ("the '222 reference") provides for an electrical junction system having utility modules comparable to the modular inserts of the '407 reference. The illustrated wiring connections for the junction box (FIGS. 1, 2, 4 and 6) are not accessible for maintenance or repair once the box has been installed behind drywall. Moreover, relying on the power cable's wires as its sole means of support once connected make them vulnerable to fracture, particularly when considering the brittleness typically induced in wiring by the cyclical heating and cooling that naturally occurs when electrical power is cycled on and off over a prolonged period. A brief reference was made to the possibility of the wires being secured to the junction box "by clamping action, or any other suitable action" (column 3, items 24a and 26). However, there is no elaboration on how that might be accomplished. It follows that, in the likely event of an electrical disconnection, the broken or loose wires would not be able to be re-connected without removal of the surrounding drywall, an unacceptable inconvenience to the user. Moreover, like the previous reference, this reference also fails to teach any improvement to the drywall installation process.

Also, U.S. Pat. Nos. 6,870,099 and 6,617,511 provide for a power distribution system very similar to that of the electrical junction system of the '222 reference, but differ in the method of connection between its junction box with its junction devices (FIGS. 1 and 3) compared with those of the '222 reference (FIGS. 2 thru 3). In similar fashion to the previous reference, the wiring connection arrangement is highly problematic and the power distribution system as a whole completely fails to teach any improvement to the drywall installation process.

U.S. Pat. Nos. 6,563,049; 6,465,735 and 6,156,971 provided for an electrical system comprised of modular components, similar to that of the '407 '222 references and U.S. Pat. No. 6,870,099. These patents detail a larger range of modular components than those recited above. See U.S. Pat. No. 6,563,049 abstract, and column 8, lines 22-38 and FIGS. 1-21. Like the '222 reference, the wiring module base (electrical box), the power cables are connected into its external surface (FIG. 2 and column 8, lines 46-59). While this version uses a more robust method of connection, the connections are still not accessible once the drywall has been permanently installed. So as before, in the event of an electrical disconnection, the electrical box cannot be re-connected without removal of the surrounding drywall. Likewise, these references also completely fail to teach any improvement to the drywall installation process.

U.S. Pat. Nos. 4,165,443; 3,157,732 and 2,920,303 were all forerunners of the above detailed prior art. These are also similarly problematic for power cable connection and drywall installation.

U.S. Pat. No. 7,160,148 provided for various forms of ceiling fan and other electrically powered ceiling fixtures with "easy install" features (abstract and summary). With this reference, it is still necessary to manually connect individual electrical wires to the receptacle plate from the junction box. While the receptacle plate is easier to handle than a ceiling fan or light fitting, it still has to be held in position while the electrical connections are made, while the installer must stand at the top of a ladder with his arms over his head. Moreover, when the fan or light fitting needs to be replaced, the owner is also restricted to purchasing a replacement with the same exact receptacle plate (which may well not be available). Alternatively, he would have to carry out a full installation of a completely new unit, obviating the whole advantage of the "easy install" feature. Like the previous references, this reference failed to teach speeding up or simplifying wiring of the electrical box or installation of the drywall.

U.S. Pat. No. 8,099,878 teaches an electrical box template extension and a method for utilizing same. With this device, it is still necessary to take measurements and refer to integral leveling devices in order to accurately locate and orient the template in relation to the electrical box (column 4, lines 9-27). In essence, the only real benefit of this device is that it provides an accurate outline on an electrical box. Hole location errors are not significantly diminished over the prior art, neither is the implementation time significantly improved.

U.S. Pat. No. 3,913,235 ("the '235 reference") provides for a marking apparatus attachable to a switch, or outlet box for marking its outline on the rear face of a wall panel (abstract). This device requires that the drywall sheet be temporarily offered up into its installed position and be taken back down again, which is now an unnecessary and laborious additional step (Summary, column 1, lines 40-62). The device's accuracy depended on the drywall sheet being held in exactly the same place as its final installed position. Positional adjustments created smudges and made the correct hole location unclear. Moreover, this device does very little to speed up the process of accurate electrical box hole location and cutting.

U.S. Pat. No. 3,745,664 provides for a TEMPLET [sic] FOR ELECTRICAL BOXES (abstract). A forerunner of the '235 reference, this is a stamp which is held on an electrical box and marks the rear face of the drywall sheet (abstract). This device runs into much the same issues as the '235 reference.

REFERENCES CITED

| Cited in Patent | Filing date | Issue date | Original Assignee | Title | Document References |
|---|---|---|---|---|---|
| US20030236010 | May 22, 2003 | Dec. 25, 2003 | Michael Gorman | Safety module electrical distribution system | See U.S. Pat. No. 6,884,111 |
| US20050250378 | Apr. 20, 2005 | Nov. 10, 2005 | Michael Gorman | Safety module electrical distribution system | See U.S. Pat. No. 6,884,111 |
| US20080190640 | Apr. 21, 2008 | Aug. 14, 2008 | Protect Connect | Safety module electrical distribution system | See U.S. Pat. No. 6,884,111 |
| US20100218374 | May 14, 2010 | Sep. 2, 2010 | Protect Connect | Safety module electrical distribution system | See U.S. Pat. No. 6,884,111 |
| US20120021623 | Oct. 3, 2011 | Jan. 26, 2012 | Protect Connect | Safety module electrical distribution system | See U.S. Pat. No. 6,884,111 |
| U.S. Pat. No. 2,920,303 | Mar. 5, 1958 | Jan. 5, 1960 | Ahard R. Johnson, | ELECTRICAL TERMINAL BOX CONSTRUCTION WITH DETACHABLE | N/A |
| U.S. Pat. No. 3,157,732 | Apr. 3, 1963 | Nov. 17, 1964 | R-B Corporation, Arlington, VA | Multi-Part Electrical Junction Box and Plug-In Accessory | N/A |
| U.S. Pat. No. 3,745,664 | Jul. 2, 1971 | Jul. 17, 1973 | Altseimer; Lukas G. (Trenton, PA) | TEMPLET [sic] FOR ELECTRICAL BOXES | Abstract |
| U.S. Pat. No. 3,913,235 | Jun. 10, 1974 | Oct. 21, 1975 | Tenneson, et al. | Apparatus for marking panel | Abstract and Summary, lines 40 thru 62, column 1 |
| U.S. Pat. No. 4,165,443 | Jul. 24, 1975 | Aug. 21, 1979 | Di Arcello; Richard A., Figart; Earl C., Kelly; J. Kevin | Power distribution system | N/A |
| U.S. Pat. No. 6,156,971 | Feb. 24, 1998 | Dec. 5, 2000 | May; Lindy Lawrence | Modular electrical system | See U.S. Pat. No. 6,563,049 |
| U.S. Pat. No. 6,465,735 | Dec. 4, 2000 | Oct. 15, 2002 | May; Lindy Lawrence | Modular electrical system | See U.S. Pat. No. 6,563,049 |
| U.S. Pat. No. 6,563,049 | Dec. 4, 2000 | May 13, 2003 | May; Lindy Lawrence | Modular electrical system | Abstract and lines 22 thru 38, column 8 |
| U.S. Pat. No. 6,617,511 | Jul. 18, 2002 | Sep. 9, 2003 | Petrak Gary Lee, Schultz James Douglas, Shaw Ronald D., Weber Michael Henry | Prewired electrical apparatus having quick connect components | Abstract and FIGS. 1 and 3 |
| U.S. Pat. No. 6,870,099 | Jul. 24, 2003 | Mar. 22, 2005 | Petrak Gary Lee, Schultz James Douglas, Shaw Ronald D., Weber Michael Henry | Prewired electrical apparatus having quick connect components | Abstract and FIGS. 1 and 3 |
| U.S. Pat. No. 6,884,111 | May 22, 2003 | Apr. 26, 2005 | Protect Connect | Safety module electrical distribution system | column 2, lines 20-24 |
| U.S. Pat. No. 7,034,222 | Aug. 8, 2005 | Apr. 25, 2006 | York Roy Wayne | Electrical junction system | Abstract and FIGS. 1 and 4 |
| U.S. Pat. No. 7,081,010 | Apr. 20, 2005 | Jul. 25, 2006 | Protect Connect | Safety module electrical distribution system | See U.S. Pat. No. 6,884,111 |
| U.S. Pat. No. 7,160,148 | Aug. 3, 2005 | Jan. 9, 2007 | Angelo Fan Brace Licensing, LLC | Ceiling fixture with easy installation features | Abstract and summary |
| U.S. Pat. No. 7,744,407 | Apr. 2, 2009 | Jun. 29, 2010 | Blurton Jerry | Modular circuit boxes and associated components | Abstract, Col 1 (Summary) and FIGS. 1-27 |
| U.S. Pat. No. 7,762,838 | Apr. 21, 2008 | Jul. 27, 2010 | Protect Connect | Safety module electrical distribution system | See U.S. Pat. No. 6,884,111 |

-continued

| Cited in Patent | Filing date | Issue date | Original Assignee | Title | Document References |
|---|---|---|---|---|---|
| U.S. Pat. No. 8,028,408 | May 14, 2010 | Oct. 4, 2011 | Protect Connect | Method of manufacturing a wiring module | See U.S. Pat. No. 6,884,111 |
| U.S. Pat. No. 8,099,878 | Oct. 19, 2009 | Jan. 24, 2012 | Jon Guzallis, Niantic, CT | Electrical Box Template | Lines 9 thru 27, column 4 |

SUMMARY OF THE INVENTION

Bearing in mind the foregoing, it is a principal object of the present invention that drywall panels can now be permanently installed without first needing to mark out and cut holes for the installation of power outlets, electric switches, light fittings and ceiling fans, realizing a substantial reduction in installation time.

It is a closely related principal object of the present invention that the foregoing object can be achieved because the drywall no longer has to be offered up to the wall studs or ceiling joists for marking out of the outlet holes, brought down, cut and held back up for accuracy checks before securing permanently in place.

Another principal object of the present invention is that drywall can now more easily be installed using significantly less physical effort and less manpower with a commensurate reduction in labor costs because additional people are no longer needed to hold the drywall in place while its holes are being marked out.

An additional related object of the present invention is that the drywall does not need to be taken down for hole cutting and lifted back up to check for accuracy of hole locations and drywall does not need to be taken back down for rework of misplaced holes before being lifted up again for final installation, thus avoiding unsightly time consuming repairs.

A further object of the present invention is that the entire wiring system for any new building can now be fully tested prior to drywall installation, making any required wiring changes or repairs comparatively quick and easy.

Another object of the present invention is the elimination of extra wire lengths from within the electrical box and the simplified electrical connections speed up and simplify power outlet, electric switch, light fitting and ceiling fan installation and reduces the likelihood of wiring errors.

An additional related object of the present invention is that wire connections are much safer to accomplish over prior art because screwdriver blade puncture wounds are far less likely to occur when power outlets and such do not need to be held by hand while tightening the terminal screws.

A further object of the present invention is that worn out or defective outlets, electric switches, light fittings and ceiling fans can easily be replaced in just a few minutes, even by an inexperienced do-it-yourself installer.

Another object of the present invention is that heavy or bulky light fittings such as ceiling fans are more easily installed and removed due to the addition of an integral latching pawl arrangement and the elimination of directly wired connections.

An additional object of the present invention is that the electrical boxes no longer need to contain 12 inches of extra power cable because this can now be looped in the space behind the box with the benefit that the electrical boxes can be about half the size of the prior art versions, thereby realizing a significant savings in material resources and costs.

Other objects and advantages will become apparent to those skilled in the art upon reference to the following descriptions and the appended drawings.

In accordance with a primary aspect of the invention there is provided a cartridge style installation system comprised of various apparatus that feature such components as a magnetic block, its matching magnetic template, an innovative hole cutter, cartridge electric boxes, and such mating components as electric sockets and electric switches. The magnetic block is removably installed within the electrical box prior to installation of a drywall panel over them both. Subsequently, the matching magnetic template is attached to the outer surface of the drywall panel, it being held in place by the mutual magnetic attraction between its magnets and those of the magnetic block through the intervening drywall panel. Thus the template is accurately located for the marking of the installation hole outline. The hole cutter is then used to accurately and quickly cut the installation hole for a power outlet, electric switch, light fitting, or ceiling fan as appropriate, after the magnetic block is removed. The electrical boxes are similar in appearance to prior art, but they are significantly smaller in depth and have embedded integral electrical connections. Power cable wires are connected directly to the electrical box's electrical terminals instead of to the power outlet, electric switch, light fitting, or ceiling fan themselves. Power outlet, electric switch, light fitting and ceiling fan cartridges are similar in appearance to their standard, prior art predecessors, but they have conducting pins that plug into corresponding integral receptacles within the cartridge style electrical boxes. The cartridge style power outlet, electric switch, light fitting and ceiling fan cartridges themselves need no wiring for installation into their cartridge style electrical boxes. Their conducting pins are inserted into corresponding receptacles within the electrical box and then they're fastened into place with screws in similar fashion to prior art, then covered with a standard cover plate or ceiling rose. The cartridge style light fittings and ceiling fans have the additional optional feature of a latching pawl, which holds them temporarily in place while they're being fastened into their permanent installed position.

In accordance with a secondary aspect of the present invention the foregoing description can be viewed as a method rather than as an apparatus. Therefore, the electrical box is disposed where desired and wired, a removable magnetic block is temporarily placed in the electrical box, drywall is installed over the box, the magnetic template is placed over the drywall in the proper location as determined by the magnets, the hole placement is marked, the template is removed, the hole cutter cuts the hole, the magnetic block is removed, and the electric outlet, electric switch or the like is plugged into the electric box as described above and then a cover plate is applied in the conventional manner. A similar approach is applied to ceiling installations such as a light fitting or ceiling fan.

BRIEF DESCRIPTION OF THE DRAWINGS

Various other features of the invention will become apparent to those skilled in the art from the following discussion taken in conjunction with the appended drawings, in which:

FIG. 2 is a front isometric view of a cartridge style electrical box and magnetic block assembly.

FIG. 3a is a rear isometric view of a magnetic block assembly.

FIG. 3b is a front isometric view of a magnetic block assembly.

FIG. 4 is a bottom isometric view of a magnetic template assembly.

FIG. 5 is a front isometric view of a magnetic template assembly installed on drywall.

FIG. 7 is a front isometric view of a cartridge style electrical box and a cartridge style power outlet cartridge.

FIG. 8a is a bottom isometric view of a cartridge style power outlet cartridge.

FIG. 8b is a top isometric view of a cartridge style power outlet cartridge.

FIG. 9 is a front isometric view of a cartridge style electrical box with cartridge style power outlet cartridge installed.

FIG. 10a is a front isometric view of a cartridge style electric switch.

FIG. 10b is a rear isometric view of a cartridge style electric switch.

FIG. 15 is a front isometric view of a magnetic block assembly aligned with a cartridge style electrical box.

FIG. 16a is a bottom isometric view of a magnetic block assembly.

FIG. 16b is a top isometric view of a magnetic block assembly.

FIG. 17 is a bottom isometric view of a light fitting latching assembly and a cartridge style light fitting aligned with a cartridge style electrical box.

FIG. 18a is a rear isometric view of a light fitting latching assembly and a cartridge style light fitting.

FIG. 18b is a front isometric view of a light fitting latching assembly and a cartridge style light fitting.

FIG. 20 is a side orthogonal view of a ceiling rose installed on cartridge style electrical box, a light fitting latching assembly and cartridge style light fitting.

FIG. 21 is a sectioned rear isometric view of a ceiling rose installed on cartridge style electrical box, light fitting latching assembly and cartridge style light fitting.

DETAILED DESCRIPTION OF THE PREFERRED EMBODIMENTS

Figure 1:
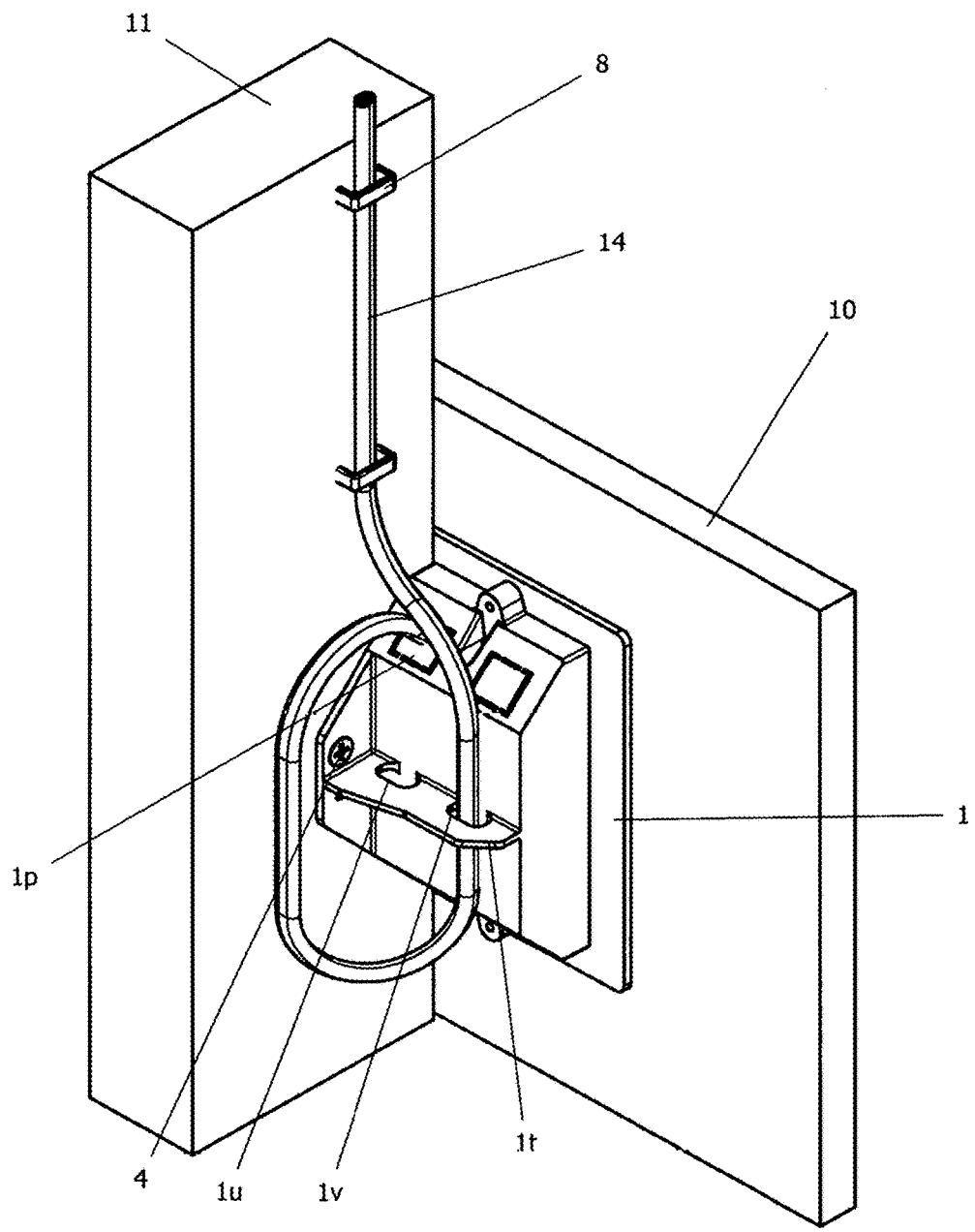
FIG. 1 is a rear isometric view of a cartridge style power outlet assembly in its installed configuration.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Reference is now made to the drawings, wherein like characteristics and features of the present invention shown in the various figures are designated by the same reference numerals.

FIG. 1 shows an isometric view of the rear of one prototype version of the efficient installation electrical hardware system in its installed configuration. This first preferred embodiment is for a power outlet and it is illustrated to show how it would look from inside a wall. Item 11 is a piece of a standard timber wall stud, also commonly referred to as "two by four." It represents the wall studs conventionally installed within interior walls to make up the supporting frame of a typical domestic or commercial room. Item 10 is a small piece of drywall, representing part of the internal wall surface of such a typical room. In this version, item 1 is in this case, the plastic, cartridge style electrical box fixed in position by screw 4 (×3) to wall stud 11. In this rear view, no more than one of screw 4 is visible. Item 14 is the power cable carrying electrical power into cartridge style electrical box 1. Note that as is conventional practice, power cable 14 is held in place against the wall stud by metal staples, item 8. Power cable 14 is routed through power cable routing hole 1v in web 1t protruding from the rear face of cartridge style electrical box 1. Power cable routing hole 1u in web 1t is not used in this embodiment, though both routing holes are used when an electric switch is part of the embodiment. Power cable 14 is looped around in order to provide at least twelve inches of useable spare power cable commonly called for by the building codes in many States. In this embodiment, similar to prior art, power cable 14 is fed into the rear of cartridge style electrical box 1 through punch-out tab 1p; one of four such punch-out tabs; 1p, 1q, 1r and 1s (refer to FIGS. 11 and 12). Punch-out tab 1p is illustrated in its un-punched configuration. Nonetheless, for the purpose of all the diagrams in FIGS. 1 thru 9, the reader is instructed to consider punch-out tab 1p as being punched out.

FIG. 2 shows an isometric view of one embodiment of magnetic block assembly 3 aligned with pin receptacle terminals 1aa, 1bb, 1cc and 1dd of cartridge style electrical box 1. Also shown are ground wire 14a, neutral wire 14b and hot wire 14c of power cable 14 as well as the other two screw 4's used to fix cartridge style electrical box 1 to wall stud 11.

FIGS. 3a and 3b show two other isometric views of the same embodiment of magnetic block assembly 3, illustrating the electrically isolated pin arrangement that is designed to fit within the pin receptacle terminals, 1aa, 1bb, 1cc, and 1dd of cartridge style electrical box 1 as illustrated in FIG. 2. Electrically isolated pin 3*a* of magnetic block assembly 3 fits into pin receptacle terminal 1*aa* of cartridge style electrical box 1 in FIG. 2. Electrically isolated pin 3*b* of magnetic block assembly 3 fits into pin receptacle terminal 1*bb* of cartridge style electrical box 1 in FIG. 2. Electrically isolated pin 3*c* of magnetic block assembly 3 fits into pin receptacle terminal 1*cc* of cartridge style electrical box 1 in FIG. 2. Electrically isolated pin 3*d* of magnetic block assembly 3 fits into pin receptacle terminal 1*dd* of cartridge style electrical box 1, in FIG. 2. FIG. 3*b* also illustrates two cylindrical magnets 3*i* and 3*j* housed within magnetic block assembly 3.

FIG. 4 shows an isometric view of one embodiment of magnetic template assembly 9 and illustrates cylindrical magnets 9*i* and 9*j* housed within magnetic template assembly 9. Also identified are template holes 9*g* and 9*h*.

FIG. 5 shows an isometric view of the same embodiment of magnetic template assembly 9 on the face of drywall 10. Magnetic template assembly 9 is held in place by mutual magnetic attraction through drywall 10 between its two cylindrical magnets 9*i* and 9*j* and the corresponding two cylindrical magnets 3*i* and 3*j* of magnetic block assembly 3 installed within cartridge style electrical box 1 not visible here, but illustrated at FIGS. 2, 3*a* and 3*b*. Not illustrated here, but shown in FIG. 6, a penciled outline is drawn around magnetic template assembly 9 on drywall 10.

Figure 6:
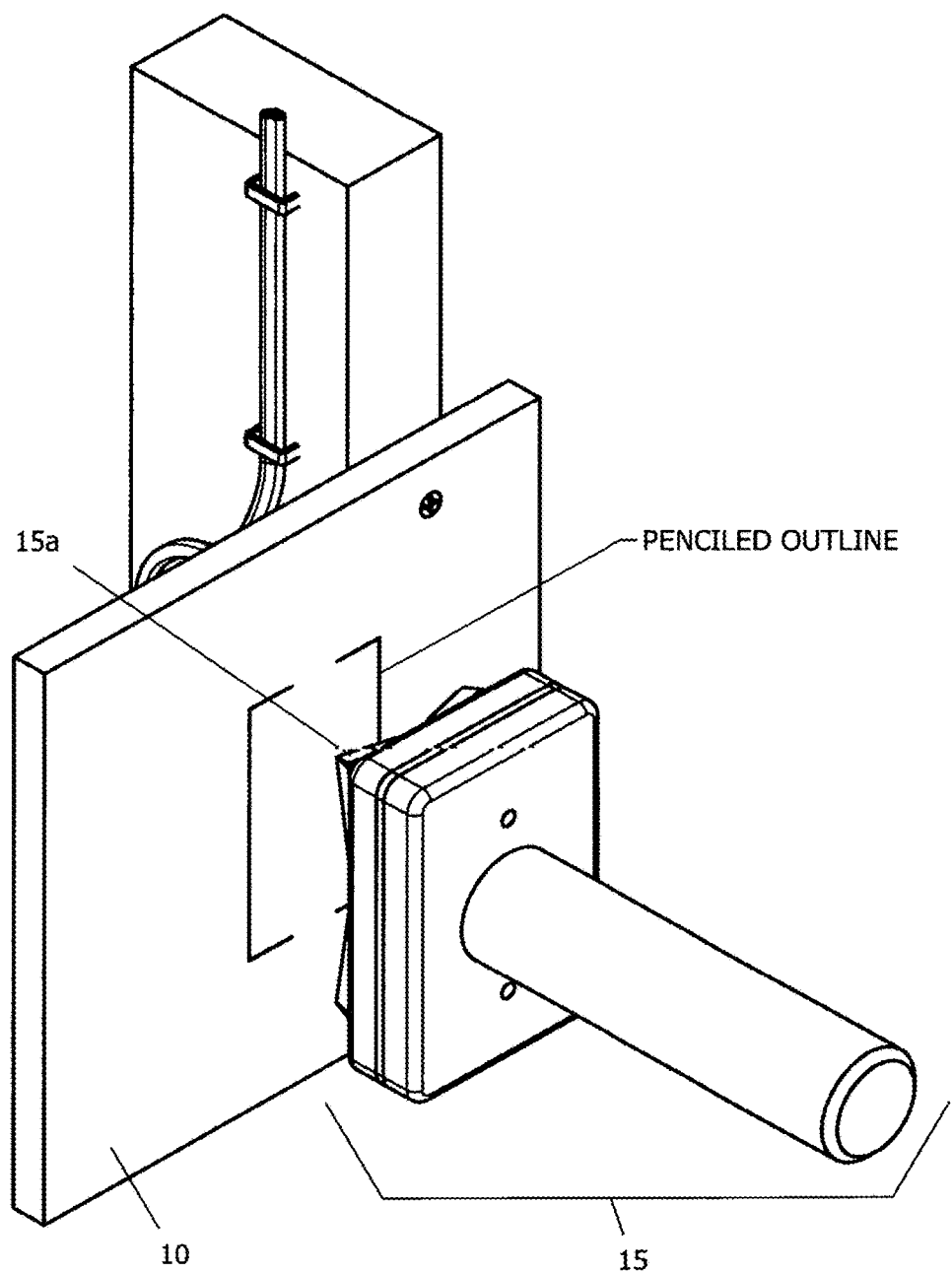
FIG. 6 is a front isometric view of a hole cutter assembly aligned with a magnetic template's outline.

FIG. 6 shows an isometric view of one embodiment of hole-cutter 15 aligned with the penciled outline marked on drywall 10. Specifically, blade set 15*a* of hole-cutter 15 is aligned with the penciled outline created using magnetic template assembly 9.

Figures 11, 12:
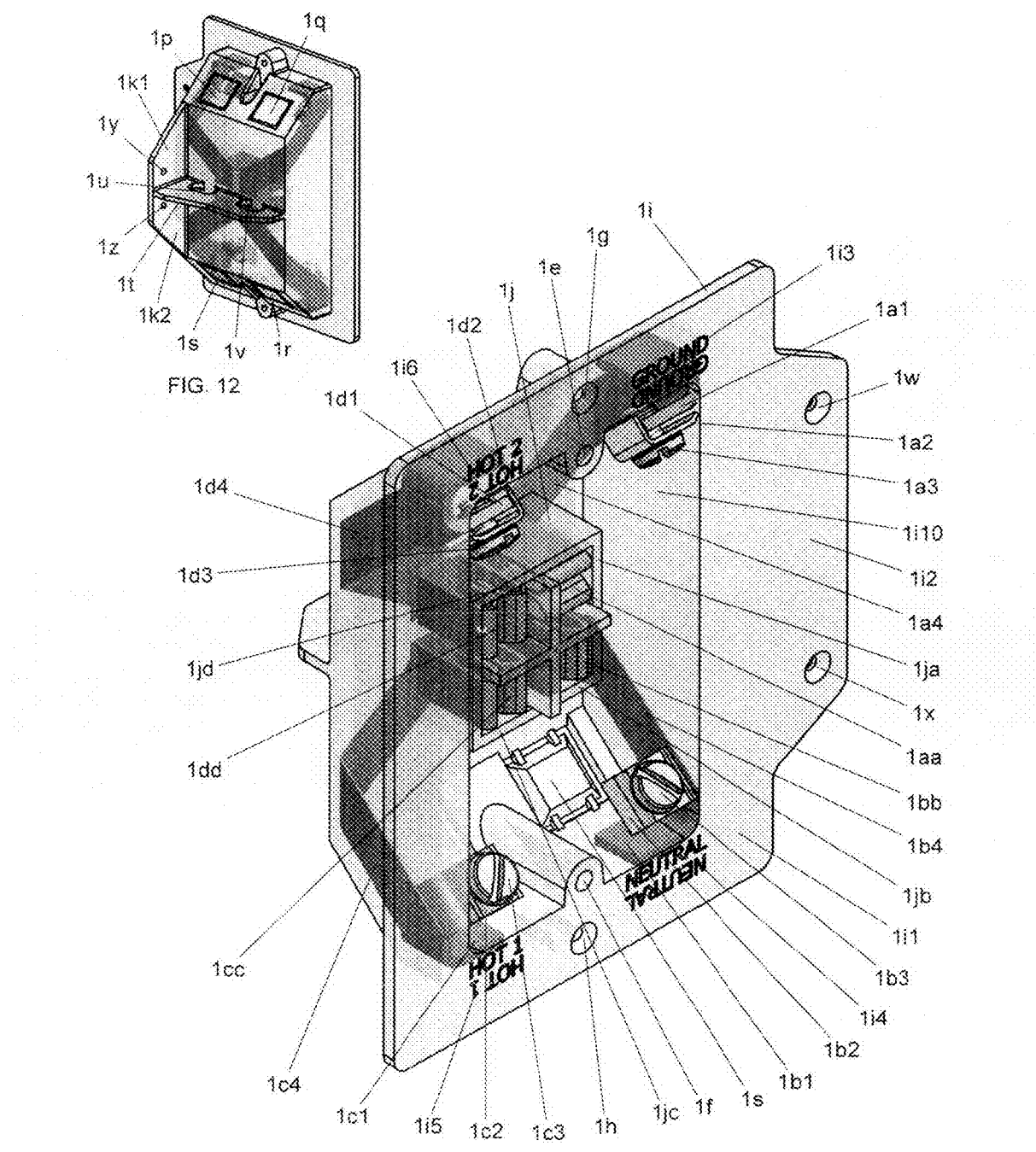
FIG. 11 is a front isometric view of a cartridge style electrical box.
FIG. 12 is a rear isometric view of a cartridge style electrical box.

FIG. 7 shows an isometric view of one embodiment of cartridge style power outlet cartridge 2 aligned with pin receptacle terminals 1*aa*, 1*bb*, 1*cc*, and 1*dd* and power outlet installation holes 1*e* and 1*f* of cartridge style electrical box 1. Cartridge style electrical box 1 can be seen through the rectangular cut-out hole in drywall 10 that was cut by hole-cutter 15 shown in FIG. 6. Power outlet installation hole 1*e* is not visible in this view, but is shown in FIG. 11. Also illustrated are installation screws 2*e* and 2*f*, designed to fit within power outlet installation holes 1*e* and 1*f* of cartridge style electrical box 1. Also illustrated are, spacers 2*m* and 2*n*.

FIGS. 8*a* and 8*b* show two other isometric views of this embodiment of cartridge style power outlet cartridge 2, illustrating the arrangement of conducting pins 2*a*, 2*b* and 2*c* that are designed to fit within pin receptacle terminals 1*aa*, 1*bb* and 1*cc* respectively of cartridge style electrical box 1 as illustrated in FIG. 7. Installation screws 2*e* and 2*f*, designed to fit within power outlet installation holes 1*e* and 1*f* of cartridge style electrical box 1. Also illustrated are ground tabs 2*k* and 2*l* and threaded hole, 2*o*. Conducting pin 2*a* of cartridge style power outlet cartridge 2 fits into pin receptacle terminal 1*aa* of cartridge style electrical box 1 in FIG. 7. Conducting pin 2*b* of cartridge style power outlet cartridge 2 fits into pin receptacle terminal 1*bb* of cartridge style electrical box 1 in FIG. 7. Conducting pin 2*c* of cartridge style power outlet cartridge 2 fits into pin receptacle terminal 1*cc* of cartridge style electrical box 1 in FIG. 7. Installation screw 2*f* fits into power outlet installation hole 1*f* of cartridge style electrical box 1 illustrated in FIGS. 7 and 11. Installation screw 2*e* fits into power outlet installation hole 1*e* of cartridge style electrical box 1 illustrated in FIG. 11, but not visible in FIG. 7.

FIG. 9 shows an isometric view of the same embodiment of cartridge style power outlet cartridge 2 fully installed within pin receptacle terminals 1*aa*, 1*bb* and 1*cc* and power outlet installation holes 1*e* and 1*f* of cartridge style electrical box 1 and fixed in place with installation screws 2*e* and 2*f*. In this view, cartridge style power outlet cartridge 2 can be seen in its installed position within the rectangular cut-out hole in drywall 10. Also shown is power outlet cover plate 13 aligned with hole, 2*o* of cartridge style power outlet cartridge 2. It also shows cover plate mounting screw 12 aligned with mounting hole, 13*o* of power outlet cover plate 13 and hole, 2*o* of cartridge style power outlet cartridge 2.

FIGS. 10*a* and 10*b* show two isometric views of the first preferred embodiment of the cartridge style electric switch 17 which may also be used with cartridge style electrical box 1 along with a wiring arrangement appropriate for an electrical switch. Conducting pins 17*a*, 17*b*, 17*c* and 17*d* are designed to fit within pin receptacle terminals, 1*aa*, 1*bb*, 1*cc*, and 1*dd* respectively of cartridge style electrical box 1 similar to conducting pins 2*a*, 2*b* and 2*c* of cartridge style power outlet cartridge 2 as illustrated in FIGS. 7, 8*a* and 8*b*. Also illustrated are installation screws 17*e* and 17*f*, designed to fit within power outlet installation holes 1*e* and 1*f* of cartridge style electrical box 1 illustrated in FIG. 11; also shown are ground tabs 17*k* and 17*l*, spacers 17*m* and 17*n* and switch cover plate mounting holes 17*x* and 17*y*.

FIG. 11 shows an isometric view of the first preferred embodiment of the cartridge style electrical box 1 as is illustrated in FIGS. 1, 2 and 7. However, in this view and in FIG. 12, plastic housing 1*i* of cartridge style electrical box 1 is shown as transparent plastic in order to properly illustrate the embedded and partially embedded components which are shaded in order to distinguish them from each other and Plastic housing 1*i*. Plastic housing 1*i* provides a cavity suitable to house and electrically insulate cartridge style power outlet cartridge 2 and the end connections of power cable 14 from their surroundings. Plastic housing 1*i* also provides the structural foundation and mountings for all the electrical hardware of cartridge style electrical box 1. Specifically, plastic housing 1*i* provides the structural support and electrical insulation for electrical conductors 1*a*4, 1*b*4, 1*c*4 and 1*d*4 which are embedded within its walls. These conduct electrical current between pin receptacle terminals 1*aa*, 1*bb*, 1*cc* and 1*dd* and terminal bases 1*a*1, 1*b*1, 1*c*1 and 1*d*1 respectively. Specifically, electrical conductor 1*a*4 is electrically connected to horizontally oriented pin receptacle terminal 1*aa*. Pin receptacle terminal 1*aa* is embedded within the rear wall of plastic housing 1*i* and is designed to accommodate and make electrical connection with conducting pin 2*a* of cartridge style power outlet cartridge 2, refer to FIGS. 7 and 8*a*. The majority of pin receptacle terminal 1*aa* is exposed to view, but sits within top, right hand quadrant, 1*ja* of a raised rectangular structure, or box 1*j* which is subdivided into four compartments, quadrants 1*ja*, 1*jb*, 1*jc* and 1*jd* and protrudes forward from the approximate center of the rear wall of plastic housing 1*i*. The other end of electrical conductor 1*a*4 is electrically connected to terminal base 1*a*1. Terminal base 1*a*1 is embedded within the right hand & upper walls of plastic housing 1*i* beneath the "GROUND" label 1*i*3 and along with terminal clamp 1*a*2 and machine screw 1*a*3 is designed to accommodate and make electrical connection with the ground wire 14*a* of power cable 14 (FIG. 2). In this version, approximately half of terminal base 1*a*1 is embedded within the upper and right hand walls of plastic housing 1*i*, with the threaded portion exposed to view and protruding at an angle of approximately 45° to front flange face 1*i*1 of plastic housing 1*i*. Terminal clamp 1*a*2 is secured to terminal base 1*a*1 by machine screw 1*a*3. This makes for a continuous electrical connection between terminal base 1a1, terminal clamp 1a2, electrical conductor 1a4 and pin receptacle terminal 1aa. Electrical conductor 1b4 is electrically connected to vertically oriented pin receptacle terminal 1bb. Pin receptacle terminal 1bb is embedded within the rear wall of plastic housing 1i and is designed to accommodate and make electrical connection with conducting pin 2b of cartridge style power outlet cartridge 2, refer to FIGS. 7 and 8a. The majority of pin receptacle terminal 1bb is exposed to view, but sits within the bottom right hand quadrant, 1jb of the box 1j. The other end of electrical conductor 1b4 is electrically connected to terminal base 1b1. Terminal base 1b1 is embedded within the right hand and lower walls of plastic housing 1i above "NEUTRAL" label 1i4 and along with terminal clamp 1b2 and machine screw 1b3 is designed to accommodate and make electrical connection with neutral wire 14b of power cable 14 (ref FIG. 2). In this version, approximately half of terminal base 1b1 is embedded within the bottom and right hand walls of plastic housing 1i, with the threaded portion exposed to view and protruding at an angle of approximately 45° to front flange face 1i1 of plastic housing 1i. Terminal clamp 1b2 is secured to terminal base 1b1 by machine screw 1b3. This makes for a continuous electrical connection between terminal base 1b1, terminal clamp 1b2, electrical conductor 1b4 and pin receptacle terminal 1bb. Electrical conductor 1c4 is electrically connected to vertically oriented pin receptacle terminal 1cc. Pin receptacle terminal 1cc is embedded within the rear wall of plastic housing 1i and is designed to accommodate and make electrical connection with conducting pin 2c of cartridge style power outlet cartridge 2, refer to FIGS. 7 and 8a. The majority of pin receptacle terminal 1cc is exposed to view, but sits within the bottom left hand quadrant, 1jc of the box 1j. The other end of electrical conductor 1c4 is electrically connected to terminal base 1c1. Terminal base 1c1 is embedded within the left hand and lower walls of plastic housing 1i above "HOT 1" label 1i5 and along with terminal clamp 1c2 and machine screw 1c3 is designed to accommodate and make electrical connection with hot wire 14c of power cable 14 (ref FIG. 2). In this version, approximately half of terminal base 1c1 is embedded within the bottom and left hand walls of plastic housing 1i, with the threaded portion exposed to view and protruding at an angle of approximately 45° to front flange face 1i1 of plastic housing 1i. Terminal clamp 1c2 is secured to terminal base 1c1 by machine screw 1c3. This makes for a continuous electrical connection between terminal base 1c1, terminal clamp 1c2, electrical, conductor 1c4 and pin receptacle terminal 1cc. Electrical conductor 1d4 is electrically connected to vertically oriented pin receptacle terminal 1dd. Pin receptacle terminal 1dd is embedded within the rear wall of plastic housing 1i and is designed to accommodate and make electrical connection with conducting pin 17d of cartridge style electric switch 17, refer to FIG. 10b (cartridge style power outlet cartridge 2 does not have a fourth conducting pin). The majority of pin receptacle terminal 1dd is exposed to view, but sits within the top left hand quadrant, 1jd of the box 1j. The other end of electrical conductor 1d4 is electrically connected to terminal base 1d1. Terminal base 1d1 is embedded within the left hand and upper walls of plastic housing 1i beneath "HOT 2" label 1i6. In some versions it is unconnected. However, in other versions and along with terminal clamp 1d2 and machine screw 1d3 it is designed to accommodate and make electrical connection with the hot wire of an additional power cable as when using cartridge style electric switch 17. Approximately half of terminal base 1d1 is embedded within the top and left hand walls of plastic housing 1i, with the threaded portion exposed to view and protruding at an angle of approximately 45° to front flange face 1i1 of plastic housing 1i. Terminal clamp 1d2 is secured to terminal base 1d1 by machine screw 1d3. This makes for a continuous electrical connection between terminal base 1d1, terminal clamp 1d2, electrical conductor 1d4 and pin receptacle terminal 1dd. Also illustrated is main cavity 1i10.

FIG. 12 shows a rear perspective view of the same embodiment of the cartridge style electrical box 1 as is illustrated in FIGS. 1, 2, 7 and 11. Illustrated in this view are web 1t and power cable routing holes 1u and 1v. Web 1t is used to add structural rigidity to plastic housing 1i and provides a way to route a loop of a minimum of twelve usable inches of spare length of power cable 14 through power cable routing holes 1u and 1v (see FIG. 1). Also identified are mounting holes 1y and 1z which are located in Rear flanges 1k1 and 1k2 which are used to add structural rigidity to plastic housing 1i and provide a way to mount cartridge style electrical box 1 to wall stud 11 with up to two of screw 4 through mounting holes 1y and 1z (refer to FIG. 1). Also identified in this view are punch-out tabs 1p, 1q, 1r and 1s.

Figure 13:
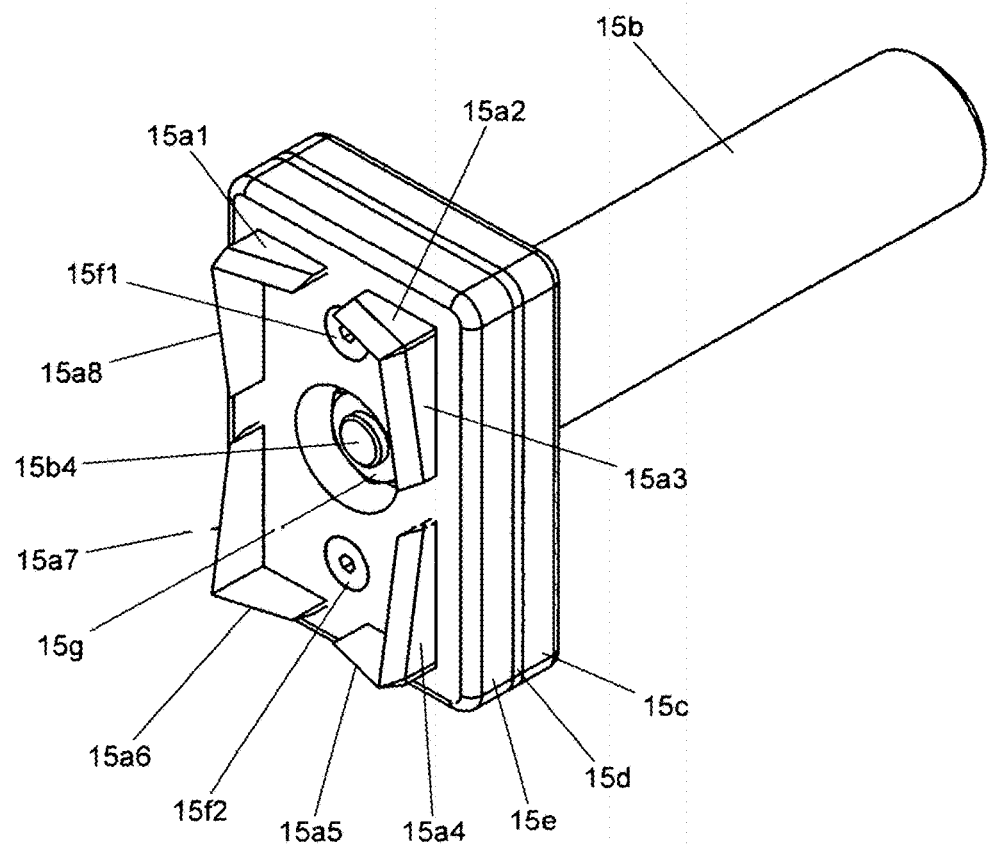
FIG. 13 is a front isometric view of a hole cutter assembly.

FIG. 13 shows an isometric view of one embodiment of hole-cutter assembly 15 as illustrated in FIG. 6. Hole-cutter assembly 15 is to be positioned with its blades 15a1 thru 15a8 against drywall 10 and aligned with the penciled outline illustrated in FIG. 6. The end of handle 15b is then struck with a suitable mallet in order to thrust blades 15a1 thru 15a8 into the surface of drywall 10. In this version of hole-cutter assembly 15, blades 15a1 and 15a5 are identical, as are blades 15a2 and 15a6, as are blades 15a3 and 15a7 and blades 15a4 and 15a8 for a total of eight blades. These blades protrude through blade mounting plate 15e which mounts them rigidly in the correct configuration against blade base plate 15c for cutting accurate holes in drywall, such as drywall 10 illustrated in FIG. 6. Blade mounting plate 15e is fixed over blade spacing plate 15d and onto blade base plate 15c by countersink screws 15f1 and 15f2 which are identical to each other in this version. Also, in this version of hole-cutter assembly 15, blade spacing plate 15d is made of a resilient material in order to allow for easy replacement of blades 15a1 thru 15a8, which may become distorted over time due to the percussive shock created by striking handle 15b with a mallet. Blade base plate 15c is fixed to handle 15b by the male threaded portion 15b4 of handle 15b screwing into it and locked in place by lock nut 15g. Handle 15b is used to hold hole-cutter assembly 15 in its correct position while the end of handle 15b is struck with a mallet (FIG. 6) mallet not shown. Blade base plate 15c is used to transmit the percussive shock produced in handle 15b by the impact of the mallet into blades 15a1 thru 15a8 and cause them to puncture the surface of drywall 10 (FIG. 6).

Method of Installation and Function of First Preferred Embodiment, FIGS. 1-13.

This method of installation procedure provides instructions on how to install the first preferred embodiment of the present invention.

We refer first to FIGS. 1, 2 and 12. Using three of screw 4, fix cartridge style electrical box 1 onto wall stud 11 at the desired height above the room's floor with its open cavity facing into the room. Specifically, use one of screw 4 to fix rear flange 1k1 of cartridge style electrical box 1 (FIG. 12) to the side of wall stud 11. Use the remaining two of screw 4 to fix lobe 1i2 of cartridge style electrical box 1 to the room side edge of wall stud 11 (FIGS. 2 and 11). Using as many of metal staple 8 as needed, fix power cable 14 into place on the side of wall stud 11 as shown in FIG. 1. Strip back the sheathing of power cable 14 to expose five to six inches of ground wire 14a, neutral wire 14b and hot wire 14c (FIG. 2). Route power cable 14 through power cable routing hole 1v in web 1t which protrudes from the rear face of cartridge style electrical box 1 (FIG. 1). Loop power cable 14 around to provide a minimum of twelve inches of useable spare cable at the rear of cartridge style electrical box 1 and feed its end through punch-out tab 1p. Punch-out tab 1p is illustrated in its un-punched configuration. Nonetheless, for the purpose of all the diagrams referred to in these instructions, the reader is instructed to consider punch-out tab 1p as being punched out. Having the twelve inches of useable spare cable looped behind cartridge style electrical box 1 instead of inside it is a significant advantage over prior art for at least three reasons:

1. There is now no excess electrical wire inside cartridge style electrical box 1 to hinder the installation of cartridge style power outlet cartridge 2, or cartridge style electric switch 17.
2. The relatively short wire lengths inside cartridge style electrical box 1 are comparatively easy to tuck neatly out of the way compared to the twelve inch lengths needed in prior art.
3. A significant reduction in the use of raw materials is accomplished because cartridge style electrical box 1 can be about half the size of prior art alternatives since it no longer needs to accommodate the excess electrical wire.

Next we address FIGS. 2 and 11 and 12. Back off machine screw 1a3 sufficient to allow ground wire 14a to pass between terminal clamp 1a2 and terminal base 1a1. Pull the end of ground wire 14a towards the user threading it between terminal clamp 1a2 and terminal base 1a1 until the excess wire is taken up. Tighten machine screw 1a3 until ground wire 14a is securely gripped between terminal clamp 1a2 and terminal base 1a1 and trim off the excess wire with a pair of wire cutters. Trim back the length of neutral wire 14b as appropriate in order for it to be connected to terminal base 1b1 without any excess wire that might hinder the installation of cartridge style power outlet cartridge 2. Cut back approximately half an inch of the insulation from the end of neutral wire 14b. Back off machine screw 1b3 sufficient to allow the stripped last half inch of neutral wire 14b to pass between terminal clamp 1b2 and terminal base 1b1. Neatly tuck neutral wire 14b along the rear face of main cavity 1i10, down its right hand edge and fit its stripped end between terminal clamp 1b2 and terminal base 1b1. Tighten machine screw 1b3 until neutral wire 14b is securely gripped between terminal clamp 1b2 and terminal base 1b1 and trim off any excess wire with a pair of wire cutters. Trim back the length of hot wire 14c as appropriate in order for it to be connected to terminal base 1c1 without any excess wire that might hinder the installation of cartridge style power outlet cartridge 2. Cut back approximately half an inch of the insulation from the end of hot wire 14c. Back off machine screw 1c3 sufficient to allow the stripped last half inch of hot wire 14c to pass between terminal clamp 1c2 and terminal base 1c1. Neatly tuck hot wire 14c along rear face of main cavity 1i10, along its rear top edge, down its left hand edge and fit its stripped end between terminal clamp 1c2 and terminal base 1c1. Tighten machine screw 1c3 until hot wire 14c is securely gripped between terminal clamp 1c2 and terminal base 1c1 and trim off excess wire with a pair of wire cutters. Connecting power cables to the terminal bases is a significant advantage over prior art for at least six reasons:

1. Wire connections are more easily and quickly accomplished because the terminal bases are stable, being fixed in place relative to the wall on which cartridge style electrical box 1 is mounted, making connection an easy, two handed operation. Whereas prior art power outlets usually have to be held by hand, or left hanging while the installer holds a screw driver in one hand and the electrical wire in the other. An operation ideally requiring three hands.
2. Wire connections are much safer to accomplish over prior art because screwdriver blade puncture wounds are far less likely to occur when the power outlet doesn't need to be held by hand while tightening the terminal screws.
3. Trimming excess wire from the terminal bases is also faster and more easily accomplished because the terminal bases are fixed in place relative to the wall.
4. Appropriate wire length is much easier to gauge and trim to length because much less wire is needed inside cartridge style electrical box 1 than is the case with prior art.
5. Wire connections are typically much neater and they are faster and easier to accomplish over many prior art connections because the wire ends can be left straight and they don't need to be wrapped around the terminal screws.
6. Wiring errors are far less likely over prior art alternatives because of the orderly and uniform terminal layout and the clear, large and easily read terminal labels. Making the product much more attractive to the less skilled installer.

Now we address FIGS. 2, 3a and 3b. Insert electrically isolated pins 3a, 3b, 3c and 3d of magnetic block assembly 3 into pin receptacle terminals 1aa, 1bb, 1cc and 1dd of cartridge style electrical box 1. Make sure front face 3r1 of magnetic block assembly 3 is flush with front flange face 1i1 of cartridge style electrical box 1.

Next we turn to FIGS. 4 and 5. Trim the drywall panel to properly fit into the wall space and onto the wall studs as is appropriate for the present situation. Having done that, fasten the drywall panel into its permanent position on the wall studs with a choice of screws over cartridge style electrical box 1 containing magnetic block assembly 3. Using this version of the cartridge style power outlet, the user may employ any standard thickness of drywall from ⅜" up to ⅝" thick. The cartridge style electrical box provides at least two major advantages over the prior art alternatives:

1. Notwithstanding normal cutting to size and fit, drywall is able to be permanently installed over the cartridge style electrical box the 1st time every time. Whereas prior art often needs to have drywall offered up to its position several times in order to mark out and cut the power outlet holes and to subsequently check those holes for accurate size, shape & location.
2. Prior art electrical boxes often fit through the drywall flush with its outer surface. Whereas this "new work"* version of the cartridge style electrical box fits flush with the inner drywall surface. This reduces bowing of the drywall panel prior to hole cutting, making for a far more accurate fit of the drywall panel in its final installed position on the wall as well as more accurate hole positions.

Refer now to FIGS. 4, 5 and 6. Place front face 9r3 of magnetic template assembly 9 on the outer surface of drywall 10 in the vicinity of magnetic block assembly 3 which is now on the other side of drywall 10. Move magnetic template assembly 9 around until it snaps into position opposite magnetic block assembly 3 due to the mutual attraction between its cylindrical magnets 9i and 9j and cylindrical magnets 3i and 3j of magnetic block assembly 3. Mark the outline of magnetic template assembly 9 with a pencil on the outer surface of drywall 10. Remove magnetic template assembly 9 from the outer surface of drywall 10. Position blade set 15a of hole-cutter 15 squarely on the outer surface of drywall 10 and aligned with the penciled outline that was just made. Strike the end of handle 15b of hole-cutter 15 squarely with a suitable mallet or similar tool in order to force blade set 15a into the outer surface of drywall 10 (FIG. 6, mallet not shown).

See FIGS. 2 and 7. Withdraw hole-cutter 15 from drywall 10 and clean up the resulting rectangular cut-out hole with a suitable knife or box cutter (knife not shown). Place the user's index finger and thumb either side of magnetic block assembly 3 and withdraw it from cartridge style electrical box 1.

This system of hole location and creation is a major advantage over prior art for four reasons:
1. This hole location and creation system guarantees 100% accuracy for power outlet hole location, size and shape.
2. This hole location and creation system is much quicker than prior art.
3. This hole location and creation system substantially reduces the incidence of scrapped drywall panels.
4. This hole location and creation system presents the opportunity for suppliers to create additional revenue streams from the proprietary tools that it requires.

FIGS. 7 thru 9 and 11. Make sure that spacers 2m and 2n of this embodiment of cartridge style power outlet cartridge 2 are the appropriate length for the thickness of the drywall; ⅜" long for ⅜" thick drywall, ½" long for ½" thick drywall and ⅝" long for ⅝" thick drywall and so on. Insert conducting pins 2a, 2b and 2c of cartridge style power outlet cartridge 2 into pin receptacle terminals 1aa, 1bb and 1cc of cartridge style electrical box 1. Screw home installation screws 2e and 2f of cartridge style power outlet cartridge 2 into power outlet installation holes 1e and 1f of cartridge style electrical box 1 (power outlet installation hole 1e is shown in FIG. 11).

The cartridge style power outlet is a major improvement over prior art for at least four reasons:
1. The cartridge style power outlet snaps easily and quickly into its installed position. Whereas most prior the art alternatives need to be crammed into their power box along with and over at least three twelve inch lengths of spare wire.
2. The cartridge style power outlet's electrical connections are completed as it's snapped into its installed position without the need to attach to it any wires.
3. Worn or damaged cartridge style power outlets can be quickly replaced within the space of a few minutes.
4. Incidences of wiring errors during replacement are significantly reduced. Making the product much more attractive to the less skilled installer.

FIG. 9. Fasten power outlet cover plate 13 onto cartridge style power outlet cartridge 2 and the outer surface of drywall 10 by tightening cover plate mounting screw 12 through mounting hole 13o into hole, 2o of cartridge style power outlet cartridge 2. The cartridge style power outlet is now installed and ready for use. Once installed and ready for use, the day to day function of this version of the cartridge style power outlet is very similar to prior art power outlets, in that a user will insert the power cord plug of an electrical appliance into the cartridge style power outlet and it then provides an appropriate electrical supply to the appliance. The advantages of this arrangement are mostly realized during installation and replacement.

Cartridge style electrical box 1 is equally suitable for use with cartridge style electric switch 17.

Detailed Description—Second Preferred Embodiment. Figs. 14 Thru 21

Figure 14:
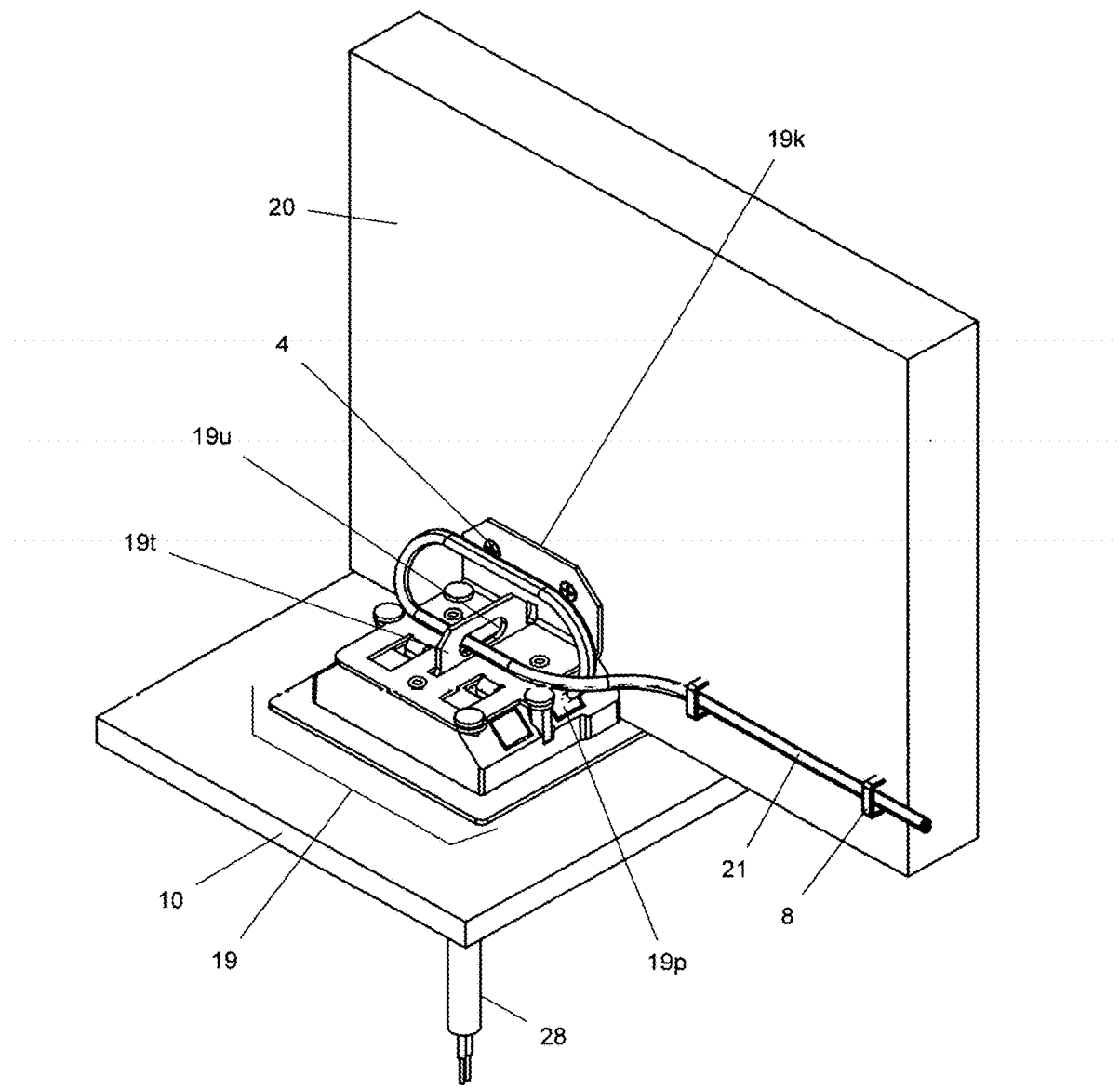
FIG. 14 is a rear isometric view of an alternate embodiment of a cartridge style power outlet assembly with a prototype light fitting variant in its installed configuration.

FIG. 14 shows an isometric view of the rear of the second preferred embodiment of the present invention. This embodiment is a prototype light fitting variant in its installed configuration, or, how it would look from above the ceiling layer of drywall. Ceiling joist 20 is a piece of a standard timber, also commonly referred to as "two by ten", "two by eight", or "two by twelve" etc., depending on its size. It represents the ceiling joists conventionally installed above a room to make up the supporting frame of a typical domestic room. Drywall 10 is a small piece of drywall or sheetrock, representing part of the ceiling of such a typical room. In this version, cartridge style electrical box 19 is fixed in position by four of screw 4 to ceiling joist 20. In this rear view, only two of screw 4 are visible. Power cable 21 carries electrical power into cartridge style electrical box 19. Note that as is conventional practice, in this version power cable 21 is held in place against the ceiling joist by staples, in this case two of staple 8. Power cable 21 is routed through power cable routing hole 19u in web 19t protruding from the rear face of cartridge style electrical box 19. In this version, power cable 21 is looped around in order to provide at least twelve inches of useable spare power cable commonly called for by the building codes in many States. In this embodiment, similar to prior art and the first preferred embodiment, power cable 21 is fed into the rear of cartridge style electrical box 19 through punch-out tab 19p. Punch-out tab 19p is shown in its un-punched configuration. Nonetheless, for the purpose of all the diagrams in FIGS. 14 to 21, the user is instructed to consider punch-out tab 19p as being punched out. Item 28 is a cut short version the light fitting support tube which is a generic mechanical connection and wiring conduit to various kinds of light fitting and ceiling fan.

FIG. 15 shows an isometric view of the front of the same version of the cartridge style electrical box 19 in its installed configuration, or how it might look from inside a room. Also shown is one embodiment of magnetic block assembly 23 aligned with pin receptacle terminals 19aa, 19bb, 19cc and 19dd of cartridge style electrical box 19. Magnetic block assembly 23 is very similar in its function to magnetic block assembly 3. The only real difference being that its shape is adapted for use with cartridge style electrical box 19.

FIGS. 16a and 16b show two other isometric views of the same embodiment of magnetic block assembly 23, illustrating the electrically isolated pins 23a, 23b, 23c and 23d designed to fit within pin receptacle terminals 19aa, 19bb and 19cc of cartridge style electrical box 19. Also shown are cylindrical magnets 23i and 23j.

FIG. 17 shows an isometric view of one embodiment of light fitting latching assembly 26 and cartridge style light fitting 27 aligned with pin receptacle terminals 19aa, 19bb and 19cc and cartridge style light fitting installation holes 19e and 19f of cartridge style electrical box 19.

FIGS. 18a and 18b show two other isometric views of these embodiments of light fitting latching assembly 26 and cartridge style light fitting 27 which are shown as one assembly. Conducting pins 27a, 27b and 27c are designed to fit within pin receptacle terminals, 19aa, 19bb, and 19cc respectively of cartridge style electrical box 19 illustrated in FIG. 17. Also shown are installation screws 26e and 26f, designed to fit within light fitting installation holes 19e and 19*f* of cartridge style electrical box 19 illustrated in FIG. 17. Light fitting alignment posts 27*jg* and 27*jh* of cartridge style light fitting 27 fit into light fitting alignment holes 19*jg* and 19*jh* of cartridge style electrical box 19 and the spring loaded latching pawls 26*je* and 26*jf* of light fitting latching assembly 26 act upon latching pawl ramps 19*je* and 19*jf* of cartridge style electrical box 19 until they engage with latching hooks 19*k*26*je* and 19*k*26*jf* of cartridge style electrical box 19 (FIG. 21). Conducting pin 27*a* of cartridge style light fitting 27 fits into pin receptacle terminal 19*aa* of cartridge style electrical box 19 in FIG. 17. Conducting pin 27*b* of cartridge style light fitting 27 fits into pin receptacle terminal 19*bb* of cartridge style electrical box 19 in FIG. 17. Conducting pin 27*c* of cartridge style light fitting 27 fits into pin receptacle terminal 19*cc* of cartridge style electrical box 19 in FIG. 17. Installation screws 26*e* and 26*f* fit through mounting holes 26*e*2 and 26*f*2 of light fitting latching assembly 26 and into light fitting installation holes 19*e* and 19*f* of cartridge style electrical box 19 in FIG. 17.

Figure 19:
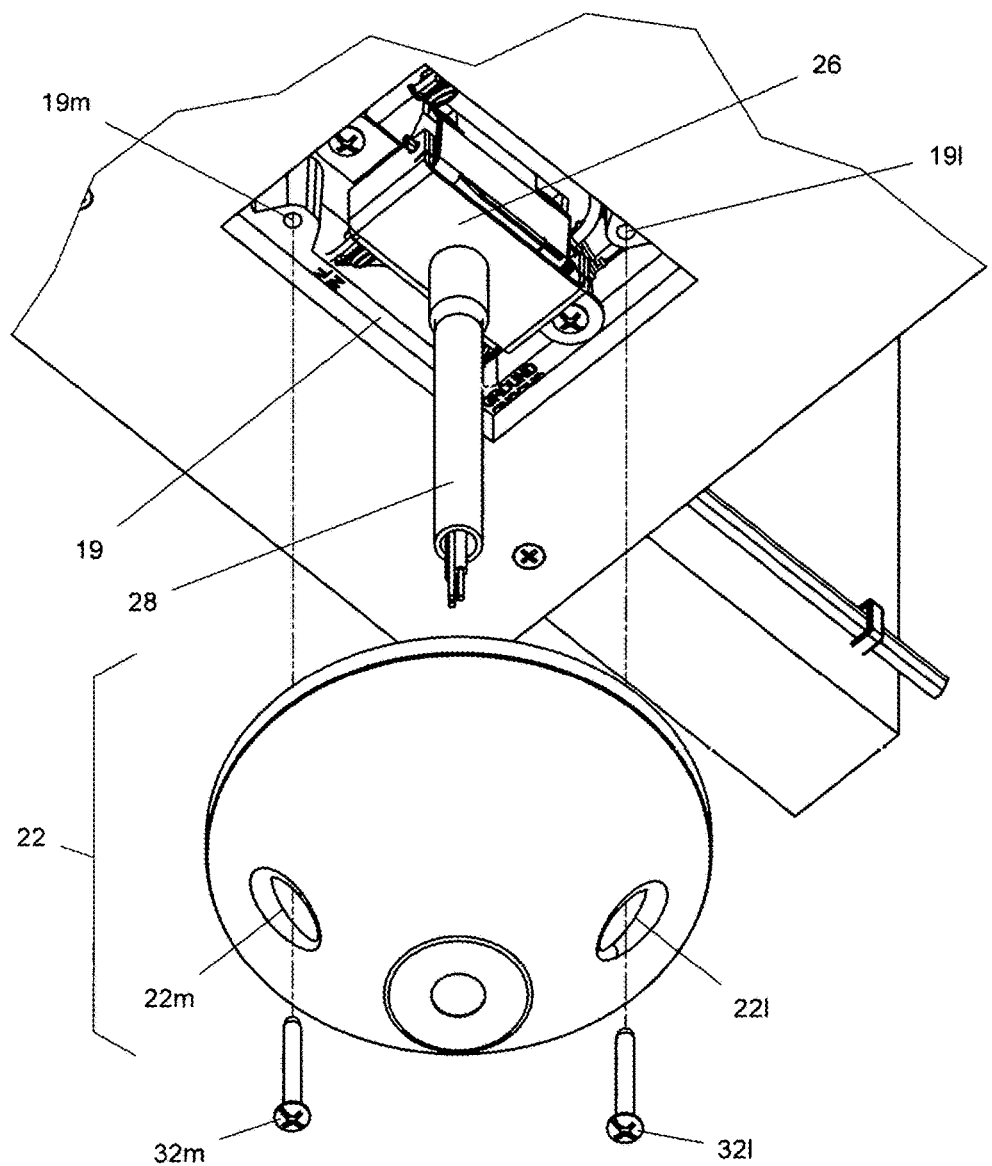
FIG. 19 is a front isometric view of a ceiling rose aligned with a cartridge style electrical box.

FIG. 19 shows an isometric view of one embodiment of ceiling rose 22 aligned with installation holes, 19*l* and 19*m* of cartridge style electrical box 19. It also shows Ceiling rose installation screws 32*l* and 32*m* aligned with holes 22*l* and 22*m* of ceiling rose 22 and installation holes, 19*l* and 19*m* of cartridge style electrical box 19. A cut short version of light fitting support tube 28 is shown installed in light fitting latching assembly 26.

FIG. 20 shows a side view of cartridge style light fitting in its installed configuration.

FIG. 21 shows a sectioned isometric view of the cartridge style light fitting in its installed configuration. In this view details are shown of how latching pawl 26*je* of light fitting latching assembly 26 engages with latching hook 19*k*26*je* of cartridge style electrical box 19. Also shown is how light fitting alignment post 27*jh* fits into light fitting alignment hole 19*jh* of cartridge style electrical box 19. Also illustrated are ceiling rose 22 and a cut short version of light fitting support tube 28 in their installed positions.

Method of Installation and Function of Second Preferred Embodiment. FIGS. 14 Thru 21.

This method of installation provides instructions on how to install the second preferred embodiment of the cartridge style electrical installation system, one of the light fitting variants. The function of this second preferred embodiment is also explained.

Refer to FIGS. 14 and 15. Using four of screw 4, fix cartridge style electrical box 19 onto ceiling joist 20 at the desired position on the room's ceiling with its open cavity facing down into the room. Specifically, use two of screw 4 to fix housing mounting bracket assembly 19*k* of cartridge style electrical box 19 to the underside of ceiling joist 20 as shown. Use the remaining two of screw 4 to fix lobe 19*i*2 of cartridge style electrical box 19 to the room side edge of ceiling joist 20 (FIG. 15). Housing mounting bracket assembly 19*k* provides the additional strength necessary to support heavier light fittings and ceiling fans. Apart from this, the first portion of the installation method for the first preferred embodiment is basically the same as it is for this second preferred embodiment. The user should start reading those instructions for FIGS. 1, 2 and 12 and stop prior to the instructions for FIGS. 7-9 and 11.

Next refer to FIGS. 17, 18*a* and 21. Now insert light fitting alignment posts 27*jg* and 27*jh* of cartridge style light fitting 27 (FIG. 18*a*) into light fitting alignment holes 19*jg* and 19*jh* of cartridge style electrical box 19 (FIG. 17). These keep the spring loaded latching pawls 26*je* and 26*jf* and mounting holes 26*e*2 and 26*f*2 of light fitting latching assembly 26 properly aligned with latching pawl ramps 19*je* and 19*jf* and light fitting installation holes 19*e* and 19*f* respectively of cartridge style electrical box 19. Push up light fitting latching assembly 26 and cartridge style light fitting 27 until the spring loaded latching pawls 26*je* and 26*jf* of light fitting latching assembly 26 engage with latching hooks 19*k*26*je* and 19*k*26*jf* of cartridge style electrical box 19 (FIGS. 18*a* and 21). Conducting pins 27*a*, 27*b* and 27*c* of cartridge style light fitting 27 (FIG. 18*a*) will now have been inserted into pin receptacle terminals 19*aa*, 19*bb* and 19*cc* of cartridge style electrical box 19 (FIG. 17). Screw home installation screws 26*e* and 26*f* through mounting holes 26*e*2 and 26*f*2 of light fitting latching assembly 26 into light fitting installation holes 19*e* and 19*f* of cartridge style electrical box 19 (FIG. 17).

Now refer to FIG. 19. Align mounting holes 22*l* and 22*m* of ceiling rose 22 with installation holes 19*l* and 19*m* of cartridge style electrical box 19 and insert Ceiling rose installation screws 32*l* and 32*m* through mounting holes 22*l* and 22*m*, then screw them into installation holes 19*l* and 19*m* of cartridge style electrical box 19. This covers over light fitting latching assembly 26 and cartridge style light fitting 27 with ceiling rose 22, providing an esthetically pleasing protection from electric shock. The cartridge style light fitting is now installed and ready for use.

In summation, this embodiment of the cartridge style light fitting may be installed as new work or also as old work as long as the user has access to the top of the ceiling joists. Once installed and ready for use, the day to day function of this second preferred embodiment of the present invention is very similar to prior art light fittings, in that a user will turn on electrical power at a electric switch or hanging cord switch, the light will illuminate and, or the fan will start to rotate. The advantages of this arrangement are mostly realized during installation and replacement. This second preferred embodiment of present invention has several more significant advantages over prior art:

1. As with embodiments one, wiring of the electrical terminals in the cartridge style electrical box is far simpler and more easily accomplished than with prior art.
2. The cartridge style electrical pin connections removes the need to make wiring connections with the light fitting or ceiling fan suspended near its final installed position and so avoids having the light fitting obstruct what was previously often a cumbersome and awkward wiring process at the top of a ladder.
3. The spring loaded latching pawl arrangement allows the light fitting or ceiling fan to be quickly and easily suspended in its correct approximate permanent installed position with holes properly aligned for quick and easy fastening of installation screws.
4. Old light fittings of this kind can be quickly replaced within the space of a few minutes, by disengaging the spring loaded latching pawl arrangement.

Figure 22:
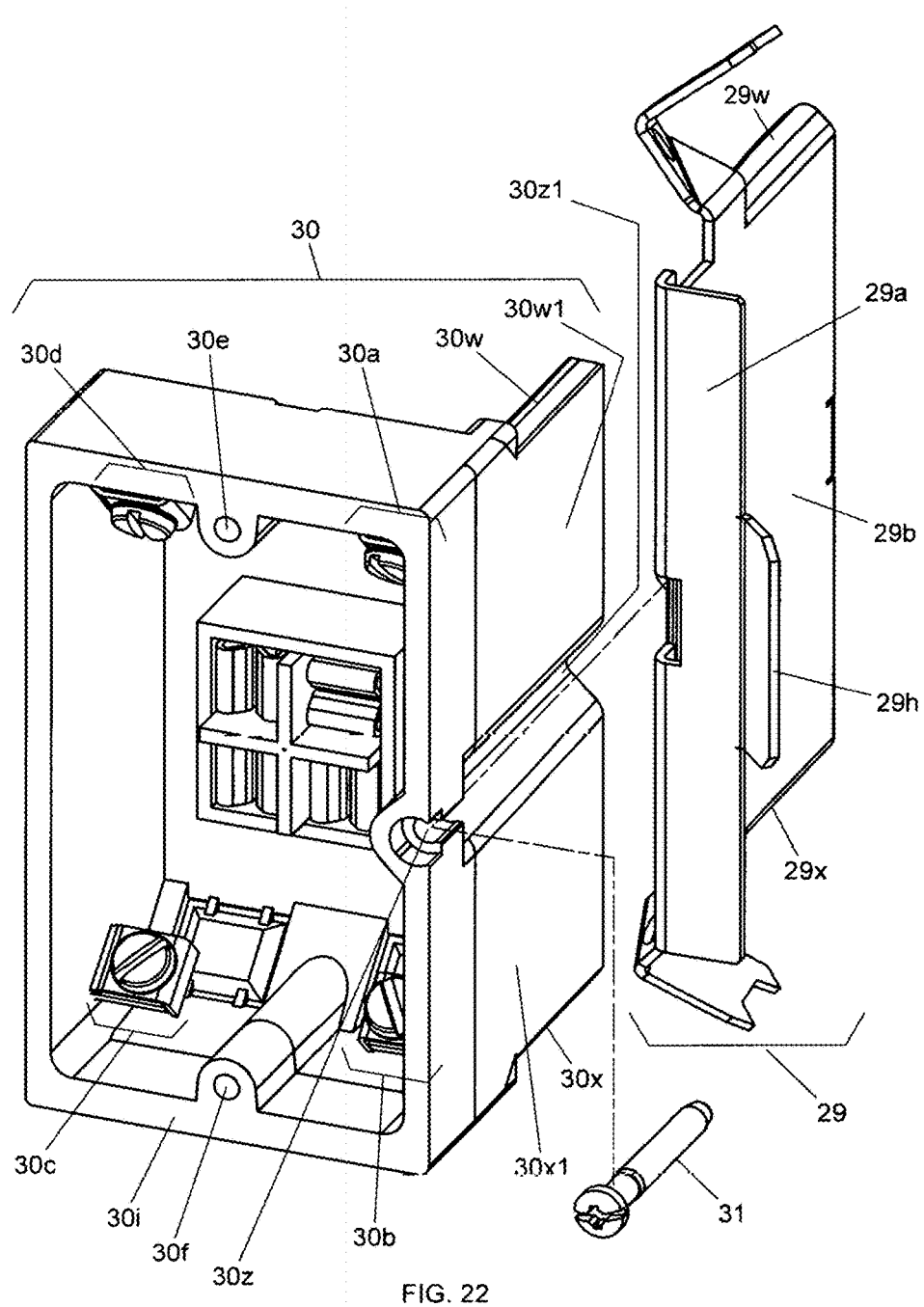
FIG. 22 is an exploded front isometric view of an old work cartridge style electrical box and an attachment bracket.
Figure 23:
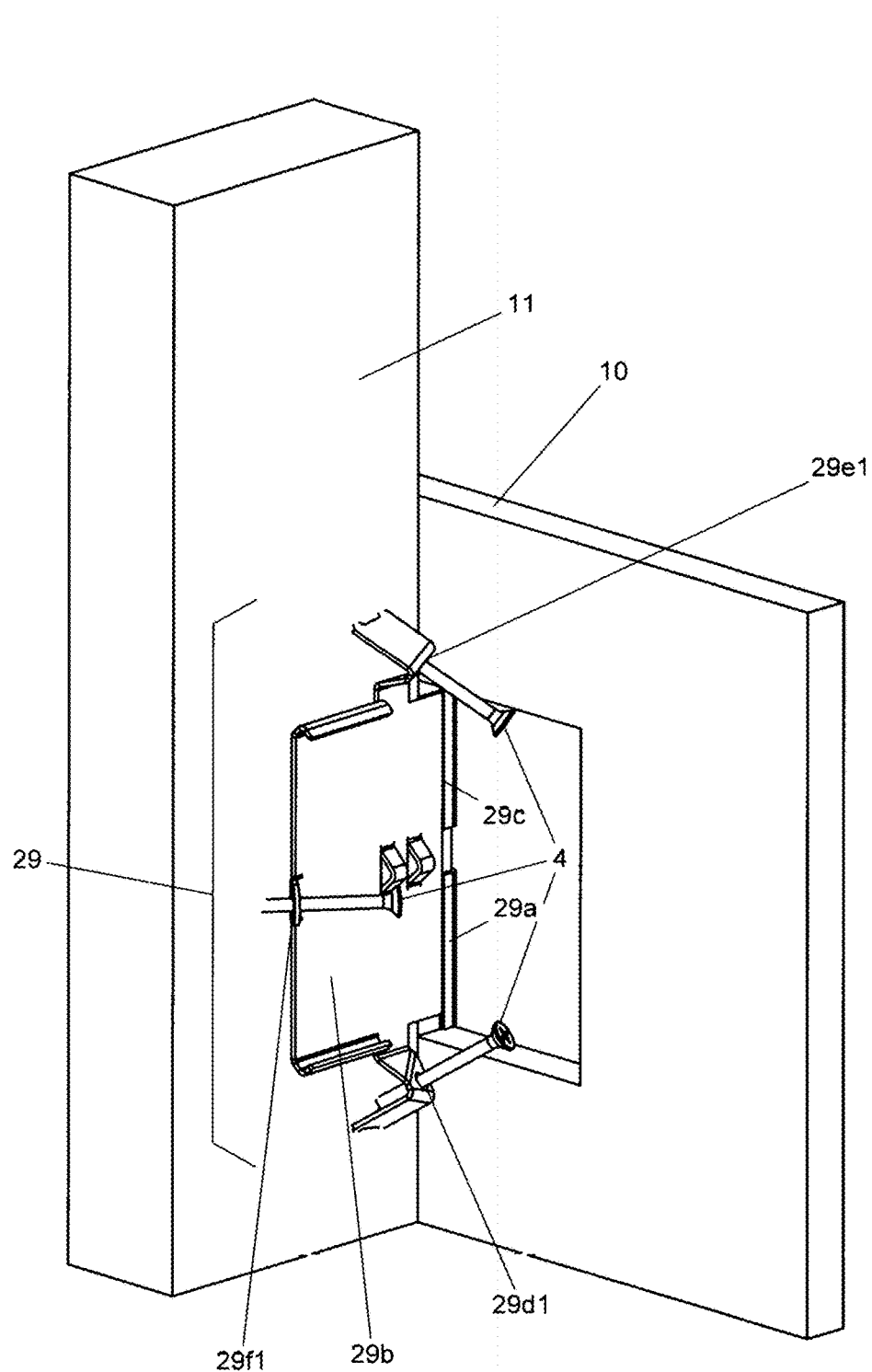
FIG. 23 is a rear perspective view of an attachment bracket fixed in place with three screws.
Figure 24:
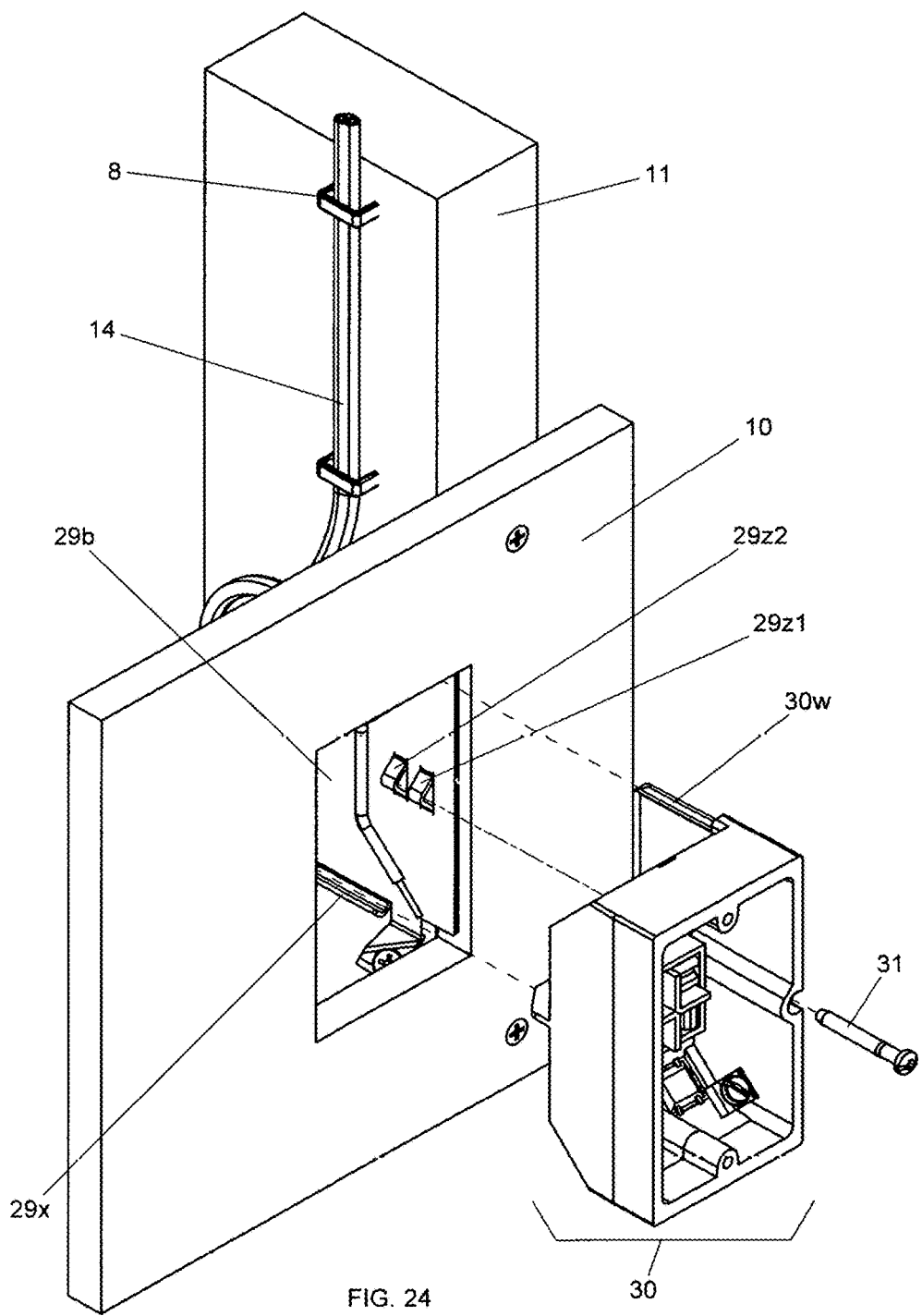
FIG. 24 is a front exploded isometric view of a cartridge style electrical box aligned with main bracket.

Detailed Description of the Third Preferred Embodiment. FIGS. 22 Thru 24.

FIG. 22 shows a partially exploded perspective view of a prototype old work version of third preferred embodiment of the present invention. This version is for power outlets and electrical switches, but the design may also be adapted for light weight light fittings. Cartridge style electrical box 30, attachment bracket 29 and captive depth adjustment screw 31 are illustrated in this view. Here it can be seen how captive depth adjustment screw 31 is located within snap-in receptacle 30*z* of cartridge style electrical box 30. Also illustrated are runners 30*w* and 30*x* of cartridge style electrical box 30 which slide between guide rails 29w and 29x of attachment bracket 29. Additionally identified are break-off flange 29a, main bracket 29b and tab 29h also of attachment bracket 29. Further identified are upper and lower flanges 30w1 and 30x1 respectively, adjustment screw clearance channel 30z1, screw terminals 30a, 30b30c and 30d and front face 30i of cartridge style electrical box 30. The functional difference between this version and the first embodiment is that it may be installed after the room's drywall panels are already in place. The main physical differences between this version and the first embodiment are:

1. Cartridge style electrical box 30 is attached to wall studs via attachment bracket 29, whereas cartridge style electrical box 1 is attached directly to wall studs without an attachment bracket.
2. Attachment bracket 29 is attached to wall stud 11 by three of screw 4 (FIG. 23).
3. Cartridge style electrical box 30 is slid into its installed position within attachment bracket 29 and secured in place with captive depth adjustment screw 31. Specifically, runners 30w and 30x of cartridge style electrical box 30 are slid in between guide rails 29w and 29x which are located at the top and bottom edges of attachment bracket 29 (FIGS. 22 and 24).
4. The installed depth of cartridge style electrical box 30 within the drywall cut-out hole is adjusted with captive depth adjustment screw 31 so that its front face is flush with the front face of drywall 10 (FIG. 24).

Cartridge style electrical box 30 accepts cartridge style power outlet cartridge 2 and cartridge style electric switch 17 basically the same way as cartridge style electrical box 1 does, but without the need for spacers 2n and 2m, or 17n and 17m (refer to FIGS. 7 and 10b). This is because front face 30i of cartridge style electrical box 30 is designed to be flush with the front face of drywall 10 (refer to FIGS. 22 and 24).

FIG. 23 shows an isometric view of attachment bracket 29 fixed onto wall stud 11 through a hole in drywall 10 with three of screw 4 through holes 29d1, 29e1 and 29f1.

FIG. 24 shows a partially exploded isometric front view of Cartridge style electrical box 30, main bracket 29b of attachment bracket 29 and captive depth adjustment screw 31. Main bracket 29b is shown installed on wall stud 11 with break-off flange 29a removed.

METHOD OF INSTALLATION AND FUNCTION OF THIRD PREFERRED EMBODIMENT, First refer to FIGS. 22 thru 24. This method of installation provides instructions on how to install the third preferred embodiment of the present invention. The function of this third embodiment is also explained.

Next turn to FIGS. 22 and 23. For the purpose of clarity, the existing old work power cable is not shown in FIG. 23. While holding attachment bracket 29 in its correct position as shown in FIG. 23, fix it in place with three of screw 4 through holes 29d1, 29e1 and 29f1 into wall stud 11. Having properly fixed attachment bracket 29 in its correct position (FIG. 23), separate break-off flange 29a from main bracket 29b by gripping tab 29h (FIG. 22) with a pair of pliers and bend it towards the user along crimp line 29c (FIG. 23). Bend it back and forth several times until it breaks away from main bracket 29b. Discard break-off flange 29a.

Now refer to FIG. 24. As with the first and second embodiments, knock out the appropriate punch-out tab(s) in the back of cartridge style electrical box 30. Then feed the end of the existing power cable through the hole. If the wires at the end of power cable 14 are damaged or are deteriorated and so long as there's sufficient spare cable length; strip back the sheathing of power cable 14 to expose five to six inches of ground wire 14a, neutral wire 14b and hot wire 14c. Now in a similar fashion to the instructions provided for FIGS. 2, 11 and 12 in the installation procedure for the first embodiment, connect ground wire 14a, neutral wire 14b and hot wire 14c to screw terminals 30a, 30b and 30c respectively. Now, if it's not already in place, snap captive depth adjustment screw 31 into snap-in receptacle 30z of cartridge style electrical box 30 as shown in FIG. 22. Now insert runners 30w and 30x of cartridge style electrical box 30 in between guide rails 29w and 29x at the top and bottom edges of main bracket 29b. Screw captive depth adjustment screw 31 into punched receptacles 29z1 and 29z2 of main bracket 29b and adjust captive depth adjustment screw 31 until front face 30i of cartridge style electrical box 30 (FIG. 22) is flush with the front face of drywall 10. Now remove spacers 2n and 2m from cartridge style power outlet cartridge 2, or spacers 17n and 17m from cartridge style electric switch 17 as appropriate (refer to FIGS. 7 and 10a). Insert cartridge style power outlet cartridge 2 (or cartridge style electric switch 17 as appropriate) into cartridge style electrical box 30 (FIG. 22). Screw installation screws 2e and 2f of cartridge style power outlet cartridge 2 (or installation screws 17e and 17f of cartridge style electric switch 17, as appropriate) all the way into installation holes 30e and 30f of cartridge style electrical box 30. Electrical connection is accomplished in the same way as it is for the first and second embodiments. As with the first preferred embodiment of the present invention, once installed and ready for use, the day to day function of this version is very similar to prior art. The advantages of this arrangement are mostly realized during installation and replacement.

GLOSSARY OF TERMS

Ceiling Joist: Wooden beam typically used to build the underlying structure of a ceiling.

Drywall panel: A rigid board made of layers of fiberboard or paper bonded to a gypsum plaster core, used instead of plaster or wood panels in construction to form walls and ceilings. Also called gypsum hoard, wallboard.

Electrical power: The electricity typically provided via the National Grid or a generator.

Latching pawl: A hook or similar device that engages within a groove in order to restrain movement in one direction.

New work electrical box: Designed for use where a room's drywall panels are yet to be installed.

Old work electrical box: Designed for use where a room's drywall panels are already in place and the electrical box has to be installed through a hole cut in the drywall.

Power cable: An electrical cable consisting of several electrical conductors, or wires some, or all of which are typically insulated and all wrapped together in an outer layer of electrical insulation. Used for running electrical power from one place to another.

Wall stud: Vertical member in the light frame construction technique called balloon framing of a building's wall. Made out sheet metal or lumber and commonly referred to as "two by four".

Wiring: 1. The act of connecting electrical wires to electrical terminals.
2. Electrical wires of any kind, usually part of or connected to some kind of electrical device.

While the invention has been described, disclosed, illustrated and shown in various terms or certain embodiments or modifications which it has assumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A wiring device installation system, comprising:
   a hole cutter having
      a handle; and
      cutting edges positionable on an exterior surface of a wall, the cutting edges being dimensioned and arranged to cut a hole through the wall upon delivery of an impact force through the handle;
   an electrical box assembly securable to a building structure,
      wherein the electrical box assembly includes a first plurality of terminals and is dimensioned and arranged for coupling to the building structure before or after delivery of the impact force, and
      wherein the hole cutter is operable, prior to or after securing of the electrical box assembly to the building structure, to cut a hole in a wall secured to the building structure; and
   at least one of
      a bracket insertable through a hole cut by the hole cutter, the bracket being securable to the building structure and adapted to receive and retain the electrical box assembly behind the wall in alignment with the hole cut by the hole cutter to thereby secure the electrical box assembly to the building structure;
      an electrical device comprising a second plurality of terminals, wherein the first and second plurality of terminals are electrical terminals configured for complementary mating engagement upon insertion of the electrical device through a hole cut by the hole cutter to thereby establish an electrical connection between the electrical box assembly and the electrical device; and/or
      a magnet block dimensioned and arranged for insertion into the electrical box assembly prior to operation of the hole cutter to create a hole aligned therewith, the magnetic block defining a third plurality of terminals configured for complementary mating engagement with the first plurality of terminals to thereby removably hold the magnet block completely within the electrical box while a magnetic template is used to create a hole pattern.

2. The system of claim 1, wherein the first plurality of terminals of the electrical box assembly are electrical pin receptacles and wherein the electrical device comprises a light fitting latching assembly including, as the second plurality of terminals, conducting pins that electrically communicate with the pin receptacle terminals of the electrical box assembly.

3. The system of claim 2, further including a light support tube dimensioned and arranged to mechanically and electrically connect the electrical box assembly to one of a light fitting and ceiling fan suspended beneath the light fitting latching assembly.

4. The system of claim 2, wherein the electrical box assembly further comprises latching pawl ramps and latching hooks and wherein the light fitting latching assembly includes spring loaded latching pawls, the spring loaded latching pawls being dimensioned and arranged to act upon the latching pawl ramps until the spring loaded latching pawls of the light fitting latching assembly engage with the latching hooks of the electrical box assembly to thereby hold the electrical box assembly and light fitting latching assembly together.

5. The system of claim 1, wherein the electrical box assembly defines a plurality of exterior runner surfaces and wherein the bracket includes respective guide rails to cooperate with corresponding runners of the electrical box.

6. The system of claim 5, wherein the electrical box assembly further includes a captive depth adjustment screw for adjusting the position of the electrical box relative to the position of the bracket to thereby adjust an alignment of electrical box and wall faces.

7. The system of claim 5, wherein the electrical device comprises a duplex receptacle or electrical switch device dimensioned and arranged to fit within the electrical box assembly.

8. The system of claim 7, wherein the first plurality of terminals of the electrical box assembly are electrical pin receptacles and wherein the duplex receptacle or electrical switch device includes, as the second plurality of terminals, conducting pins that electrically communicate with the pin receptacle terminals of the electrical box assembly.

9. A wiring device installation system, comprising:
   an electrical box assembly securable to a building structure,
      wherein the electrical box assembly includes a first plurality of terminals and is dimensioned and arranged for coupling to the building structure before or after cutting a hole in a wall of the building structure, and
   at least one of
      a bracket insertable through a hole cut by the hole cutter, the bracket being securable to the building structure and adapted to receive and retain the electrical box assembly behind the wall in alignment with the hole cut by the hole cutter to thereby secure the electrical box assembly to the building structure;
      an electrical device comprising a second plurality of terminals, wherein the first and second plurality of terminals are electrical terminals configured for complementary mating engagement upon insertion of the electrical device through a hole cut by the hole cutter to thereby establish an electrical connection between the electrical box assembly and the electrical device; and/or
      a magnet block dimensioned and arranged for insertion into the electrical box assembly prior to operation of the hole cutter to create a hole aligned therewith, the magnetic block defining a third plurality of terminals configured for complementary mating engagement with the first plurality of terminals to thereby removably hold the magnet block completely within the electrical box while a magnetic template is used to create a hole pattern.

10. The system of claim 9, wherein the first plurality of terminals of the electrical box assembly are electrical pin receptacles and wherein the electrical device comprises a light fitting latching assembly including, as the second plurality of terminals, conducting pins that electrically communicate with the pin receptacle terminals of the electrical box assembly.

11. The system of claim 10, further including a light support tube dimensioned and arranged to mechanically and electrically connect the electrical box assembly to one of a light fitting and ceiling fan suspended beneath the light fitting latching assembly.

12. The system of claim 10, wherein the electrical box assembly further comprises latching pawl ramps and latching hooks and wherein the light fitting latching assembly includes spring loaded latching pawls, the spring loaded latching pawls being dimensioned and arranged to act upon the latching pawl ramps until the spring loaded latching pawls of the light fitting latching assembly engage with the latching hooks of the electrical box assembly to thereby hold the electrical box assembly and light fitting latching assembly together.

13. The system of claim 9, wherein the electrical box assembly defines a plurality of exterior runner surfaces and wherein the bracket includes respective guide rails to cooperate with corresponding runners of the electrical box.

14. The system of claim 13, wherein the electrical box assembly further includes a captive depth adjustment screw for adjusting the position of the electrical box relative to the position of the bracket to thereby adjust an alignment of electrical box and wall faces.

15. The system of claim 13, wherein the electrical device comprises a duplex receptacle or electrical switch device dimensioned and arranged to fit within the electrical box assembly.

16. The system of claim 15, wherein the first plurality of terminals of the electrical box assembly are electrical pin receptacles and wherein the duplex receptacle or electrical switch device includes, as the second plurality of terminals, conducting pins that electrically communicate with the pin receptacle terminals of the electrical box assembly.

17. A method of installing one of a ceiling fan or a ceiling fixture, comprising:

attaching an electrical box that includes latching pawl ramps and latching hooks to a building structure;

connecting electrical wires to respective terminals of the electrical box assembly;

attaching a removable magnetic block temporarily to the electrical box;

installing drywall over the electrical box by fixedly attaching the drywall to the building structure;

placing a magnetic template over the drywall;

locating the magnetic template in its proper position as determined by the mutual magnetic attraction through the drywall of the magnetic block and the magnetic template;

marking the precise location of hole placement using the position of the magnetic template;

cutting a hole in the drywall directly over the electrical box using a hole cutter;

removing the magnetic block from the electrical box through the hole in the drywall; and installing a light fitting having conducting pins that connect to and electrically communicate with the pin receptacle terminals of the electrical box.

18. The method of claim 17, further pressing the light fitting and electrical box together such that spring loaded latching pawls of the electrical box act upon latching pawl ramps of a latching assembly of the light fitting until the spring loaded latching pawls engage with the latching hooks of the electrical box to hold the electrical box and light fitting latching assembly together.

\* \* \* \* \*